United States Patent [19]
Senda et al.

[11] Patent Number: 5,811,971
[45] Date of Patent: Sep. 22, 1998

[54] MAGNETIC SENSOR AND MAGNETIC FIELD SENSING METHOD USING SAID MAGNETIC SENSOR BASED ON IMPEDANCE CHANGES OF A HIGH FREQUENCY EXCITED CONDUCTOR

[75] Inventors: Masakatsu Senda; Osamu Ishii, both of Mito; Yasuhiro Koshimoto, Higashiyamato; Tomoyuki Toshima, Tokorozawa, all of Japan

[73] Assignee: Nippon Telegraph and Telephone Corporation, Tokyo, Japan

[21] Appl. No.: 593,387

[22] Filed: Jan. 29, 1996

Related U.S. Application Data

[62] Division of Ser. No. 294,498, Aug. 23, 1994, abandoned.

[30] Foreign Application Priority Data

Aug. 25, 1993 [JP] Japan .................................. 5-210052
Dec. 1, 1993 [JP] Japan .................................. 5-301544
Mar. 22, 1994 [JP] Japan .................................. 6-076694

[51] Int. Cl.$^6$ .............................. G01R 33/02; G11B 5/33
[52] U.S. Cl. .................... 324/244; 324/250; 324/260; 360/110
[58] Field of Search .............................. 324/244, 249, 324/250, 252, 260; 360/110

[56] References Cited

U.S. PATENT DOCUMENTS

| | | | |
|---|---|---|---|
| 3,421,075 | 1/1969 | Belson | 324/43 |
| 3,703,681 | 11/1972 | Johnson et al. | 324/249 |
| 4,635,152 | 1/1987 | Iwasaki et al. | 360/110 |
| 5,365,391 | 11/1994 | Sugiyama et al. | 360/110 |

FOREIGN PATENT DOCUMENTS

| | | |
|---|---|---|
| 0 472 162 A1 | 2/1992 | European Pat. Off. . |
| 0 501 478 A3 | 9/1992 | European Pat. Off. . |
| 1-184709 | 7/1989 | Japan . |
| 5189726 | 7/1993 | Japan . |
| 2 083 230 | 3/1982 | United Kingdom . |

OTHER PUBLICATIONS

C. Denis Mee and Eric D. Daniel, Magnetic Recording Technology, vol. 1, pp. 3–6, 1987.

W.B. Weir, "Automatic Measurement of Complex Dielectric Constant and Permeability At Microwave Frequencies," Proceedings of the IEEE, vol. 62, No. 1, Jan. 1974, at 33.

Masakatsu Senda et al., "High frequency measurement technique for patterned soft magnetic film permaebility with magnetic film/conductor/magnetic film inductance line," Review of Scientific Instruments, No. 4 (Apr., 1993), pp. 1034–1037.

H. Iwasaki et al., "Film Thickness and Width Dependence of Output Voltage Response for Read–Out Head Using Induced RF Permeability Change," IEEE Transactions on Magnetics, vol. Mag.–23, No. 5 (Sep. 1987), pp. 2506–2508.

*Primary Examiner*—Gerard R. Strecker
*Attorney, Agent, or Firm*—Finnegan, Henderson, Farabow, Garrett & Dunner, L.L.P.

[57] ABSTRACT

In a magnetic field sensing method in accordance with the invention of the present application, a magnetic sensor comprising a conductor and at least one magnetic material provided on any of the surfaces of this conductor, is employed. This magnetic sensor is disposed in the vicinity of an external magnetic field which is to be sensed, and by means of supplying a high frequency current to this conductor, the impedance of the conductor changes in accordance with the external magnetic field, and based on this, the external magnetic field is sensed.

9 Claims, 20 Drawing Sheets

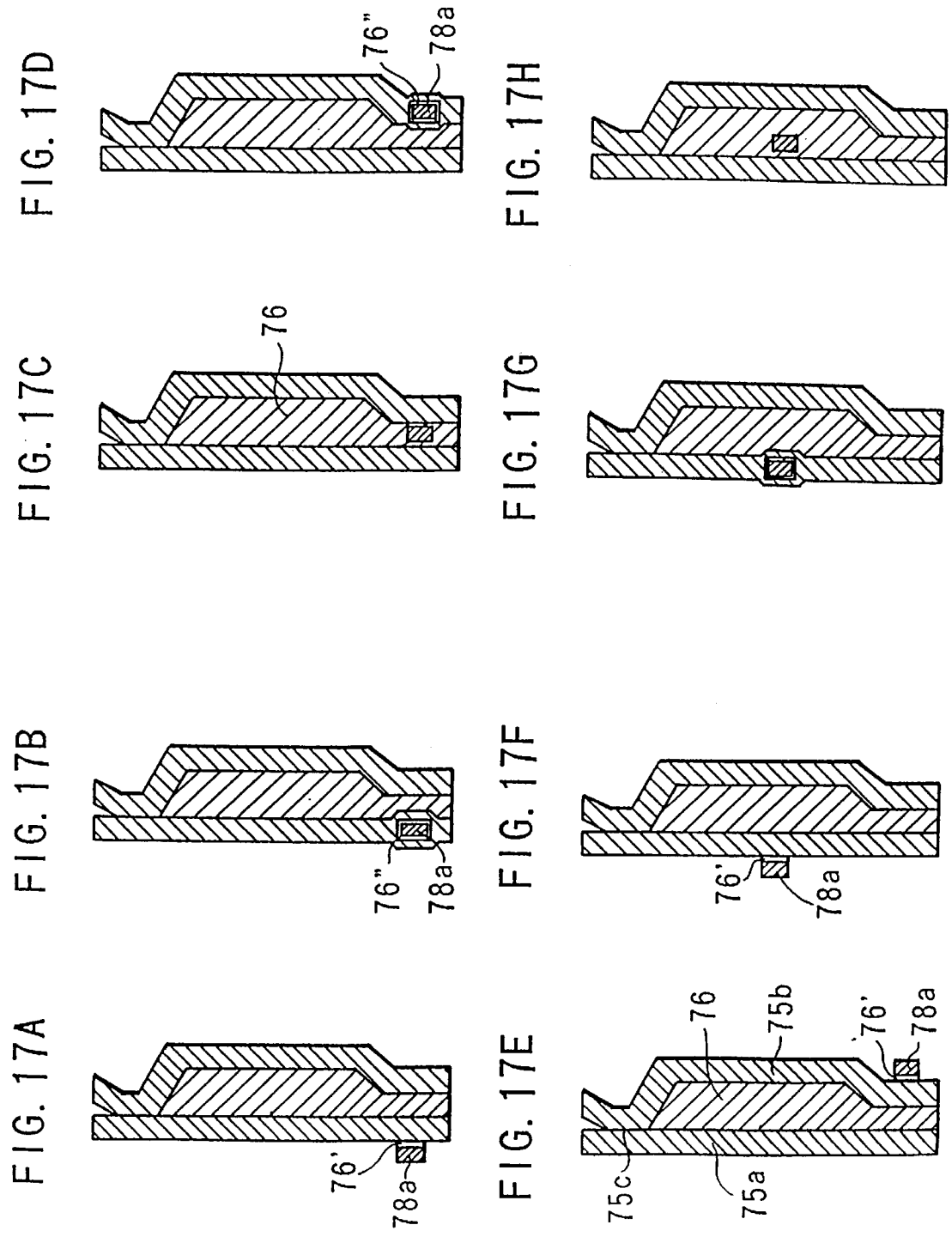

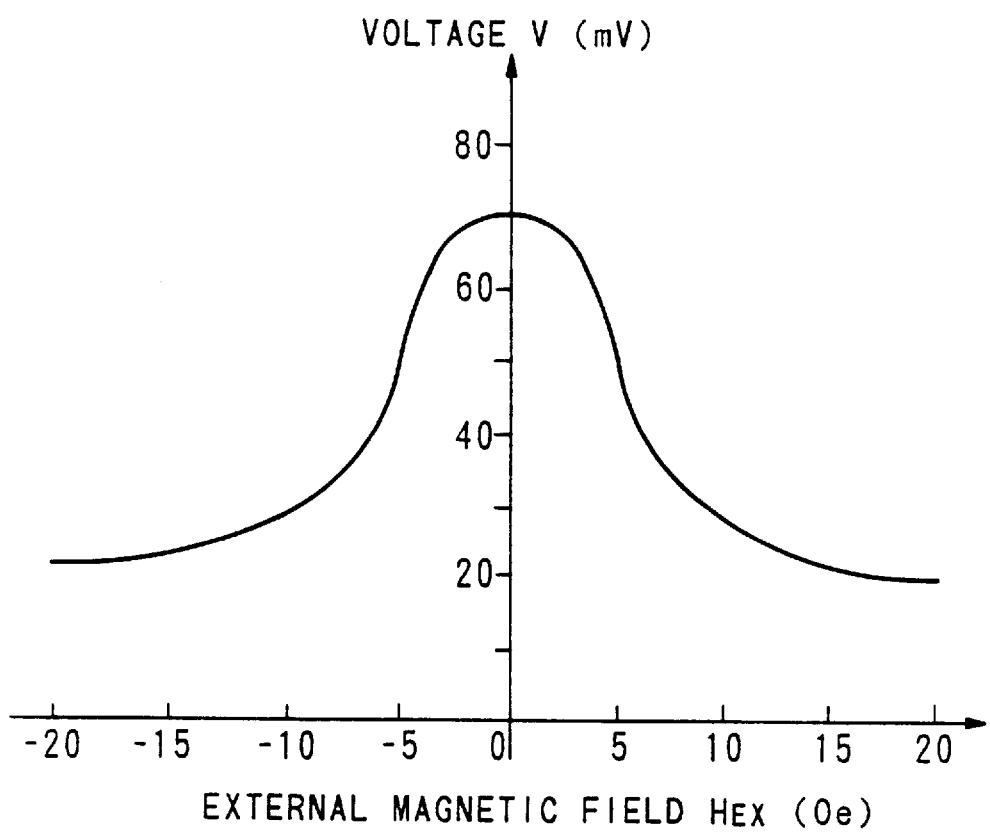

MAGNETIC SENSOR AND MAGNETIC FIELD SENSING METHOD USING SAID MAGNETIC SENSOR BASED ON IMPEDANCE CHANGES OF A HIGH FREQUENCY EXCITED CONDUCTOR

This is a divisional application of application Ser. No. 08/294,498, filed Aug. 23, 1994, now abandoned.

BACKGROUND OF THE INVENTION

1. Field of the Invention

The present invention relates to a magnetic field sensing method and apparatus, and in particular, relates to a magnetic field sensing method and apparatus for sensing an external magnetic field which is employed in a magnetic recording apparatus, a magnescale and encoder, and the like.

2. Background Art

Magnetic sensors which sense external magnetic fields are employed, for example, in magnetic recording apparatuses as magnetic heads which record and reproduce a signal in accordance with data in a magnetic recording medium, are employed in magnescales as displacement sensors which sense the displacement of an object to be sensed, and are employed in encoders as angular sensors for sensing the turning angle of motors or the like. In this specification, sensors which sense an external magnetic field are termed "magnetic sensors", and in addition, devices which possess the function of recording a signal in accordance with data on a magnetic recording medium are also termed "magnetic sensors".

One type of conventional magnetic sensor is an inductive-type magnetic head, in which a coil is wound around a magnetic core. FIG. 24A is a front view of a conventional ring-type inductive magnetic head which is produced using thin films, and FIG. 24B is a cross sectional view taken along the line A–A' in FIG. 24A (see Masaaki Nishikawa, *Magnetic Recording Theory*, published by Asakura Shoten, 1985). In FIGS. 24A and 24B, the ring-type inductive magnetic head comprises a coil 1, magnetic cores 2a and 2b, a magnetic core coupler 2c, a non-magnetic insulator 3, and electrodes 4a and 4b. A gap 5 is formed between magnetic cores 2a and 2b.

By means of recording processes and reproducing processes which will be described hereinbelow, this ring-type inductive magnetic head records and reproduces a signal on magnetic recording medium 6 in accordance with data. First, in the recording process, a current corresponding to the data which are to be recorded is caused to flow in coil 1, and magnetic cores 2a and 2b are magnetized, and thereby, magnetic recording medium 6 is magnetized as a result of the leakage magnetic field from gap 5, and a signal is recorded. In the reproducing process, as a result of the medium magnetic field generated by magnetic recording medium 6, magnetic cores 2a and 2b are magnetized, and thereby, the signal is reproduced as a result of an induced electromotive force induced in coil 1.

Recently, in the research field of magnetic recording, in concert with demands for the miniaturization and increase in capacity of magnetic recording media, an increase in the recording density of magnetic recording media has been desired. However, commonly, in concert with an increase in the recording density of magnetic recording media, the surface area within the magnetic recording medium which is magnetized as a result of a signal corresponding to one data unit is reduced, so that the strength of the magnetic field of the medium generated by the recording area corresponding to a single data unit on the magnetic recording medium is also reduced. Accordingly, in the conventional ring-type inductive magnetic head described above, there are problems in that in concert with the reduction in the strength of the magnetic field of the medium, the level of the reproduction output declines drastically and the reproduction of the signal becomes difficult.

A magnetoresistance effect-type head (hereinbelow referred to as an "MR head") has been proposed as a magnetic head capable of signal reproduction even in cases in which the strength of the magnetic field of the medium is low. FIG. 25 is an angled view showing an example of the structure of a conventional MR head. In FIG. 25, the MR head comprises a magnetoresistance element (hereinbelow referred to as an "MR element") 7, measurement lead wires 8a and 8b, DC bias conductor 9, and DC bias current supply lead wires 10a and 10b. This MR head is a head dedicated to reproduction.

In the state in which a constant DC current is passed between measurement lead wires 8a and 8b, the MR head shown in FIG. 25 expresses the change in the electrical resistance value of MR element 7, originating in the changes in strength of the medium magnetic field generated by the magnetic recording medium, as changes in voltage between measurement lead wires 8a and 8b, and thus reproduces the signal.

Conventionally, MR heads were widely employed which used the anisotropic magnetoresistance effect (hereinbelow referred to as the "MR effect") of ferromagnetic materials. The changes in the resistance value R of the MR element 7 resulting from the MR effect are expressed by Formula (1).

$$R = R_0 + \Delta R \cos^2 \theta \quad (1)$$

In Formula (1), $R_0$ indicates the resistance value of the MR element 7 when the direction of magnetization of MR element 7 and the direction of the current are perpendicular, $\Delta R$ indicates the difference in resistance between resistance value $R_0$ and the resistance value of MR element 7 when the direction of magnetization of MR element 7 and the direction of the current are parallel, and $\theta$ indicates the angle between the direction of magnetization of the MR element 7 and the direction of the current. Furthermore, the SN ratio of the MR head is expressed by the resistance change ratio $\Delta R/R_0$ (hereinbelow referred to as the "MR ratio").

The MR element is not restricted to the magnetic head described above, but rather may be employed as a displacement sensor or an angle sensor, or the like; however, recently, in the research fields of the measurement of displacement and the measurement of angles, as well, there have been demands for an increase in the resolution of the sensed displacement of the displacement sensors and the sensed angle of the angle sensors. Accordingly, in order to increase the recording density of magnetic recording apparatuses, and in order to increase the resolution of the sensed displacement of displacement sensors and the sensed angle of angle sensors, the development of a magnetic sensor employing an MR element possessing high sensitivity and a high SN ratio has been desired. This means that if the sensitivity and the SN ratio of the magnetic sensor are low, it is not merely the case that an increase in recording density and an increase in resolution become impossible, but there is a possibility that problems will occur such as, in the case of a non-contact magnetic recording apparatus, the necessity of reducing the distance between the magnetic sensor and the magnetic recording medium or the object of sensing, and the likelihood that the magnetic sensor will collide with the magnetic recording medium or the like.

When alloys such as NiFe, NiCo, and NiCu, which are representative of ferromagnetic materials which have been conventionally employed in the magnetoresistance sensor (hereinbelow referred to as an "MR sensor") of MR heads or the like, were employed, the MR ratio was low, at a level of a few percent in all cases (at room temperature), and furthermore, as regards the resistance change ΔR itself, only a small value was obtainable. Accordingly, the SN ratio and sensitivity of an MR sensor employing such alloys was insufficient.

Furthermore, the MR element 7, which was employed as a sensor element in the conventional MR head described above, was capable of conversion in only one direction, from magnetic field to an electrical resistance value, as a result of the operational principle thereof, and this was thus not reversible. Accordingly, such conventional MR heads were restricted to use as reproduction-only heads, and could not be used as recording heads.

Furthermore, as is clear from Formula (1), since the MR effect is symmetrical with respect to magnetic field inversion, in order to sense the polarity of an external magnetic field, it is necessary to move the operational point of the MR element and give asymmetry to the characteristics thereof by means of applying a DC bias magnetic field to the MR element. A DC bias magnetic field application method has been proposed in which, as shown in FIG. 25, a DC bias conductor 9 is further disposed so as to adjoin MR element 7 through the medium of an insulator (not depicted in the Figure), a DC bias current is caused to flow to the DC bias conductor 9, and the magnetic field generated at the MR element by the DC bias current is employed. However, in this method, there are problems in that the number of structural components increase, and the design and production of the parts becomes complex.

Recently, a phenomenon has been discovered in which, in a Fe/Cr multi-layer film, the MR ratio is approximately 50% (this is termed the "giant magnetoresistance effect") (M. N. Baibich, et al., Phys. Rev. Lett., Vol. 61, pp 2472–2475, 1988); however, because the operating temperature is extremely low, at 4.2K, and it is necessary to apply a strong magnetic field of 20 kOe, the effect is not suitable for practical application. Furthermore, a large hysteresis is exhibited in the dependence of the resistance on the external magnetic field, so that there is a problem in that the accuracy of the sensing of the signal is low.

As explained above, the conventional ring-type inductive magnetic head has problems in that when the recording density is increased, the reproduction output declines dramatically, and in addition, the conventional MR head possesses problems in that the SN ratio, the sensitivity, and the signal sensing accuracy are low, and furthermore, the structure of the parts is complex.

Magnetic reproduction apparatuses are disclosed in Japanese Patent Application, Second Publication, No. Hei 3-23962, and Japanese Patent Application, First Publication, Laid-Open No. Sho 60-29901. These magnetic reproduction apparatuses operate according to a principle in which changes in an external magnetic field are converted into changes in the magnetic permeability of a magnetic material, these changes in magnetic permeability are converted into changes in impedance in a measurement coil, and these changes in impedance are converted into changes in the voltage between both ends of a tuning circuit, and thereby, the variations in an external magnetic field are sensed. In such magnetic reproduction apparatuses, because a tuning circuit is employed, it is necessary that the resonance frequency thereof be brought into conformity with the magnetic resonance frequency of the magnetic material; however, in order to do this, the capacity of the condenser used for tuning must be adjusted. In the case in which the tuning state of the tuning circuit is displaced, the sensing sensitivity with respect to the external magnetic field and the like changes rapidly, so that in order to ensure stability and reliability of the apparatus, it is necessary to control the tuning with high accuracy, and there is a problem in that operations and control become difficult. Furthermore, it is necessary to increase the Q of the tuning circuit in order to increase the sensing sensitivity with respect to the external magnetic field; however, in this case, the tuning circuit has a narrow band. In addition, when the tuning circuit acquires a narrow band, the output voltage value is dependent on the frequency of the magnetic field which is sensed, and this causes a problem from the point of view of the stability and reliability of the apparatus. In such a case, the output voltage of the tuning circuit becomes smaller when the signal becomes higher, so that the band width in which signals can be sensed is restricted. For example, in high-definition video, the signal frequency is on the level of 80 MHz, so that in the case in which this signal is sensed by means of amplitude modulation, a band width of 160 MHz or more is necessary. Furthermore, in magnetic recording apparatuses having high recording density, the realization of which is predicted for the future, it is predicted that a band width of 100–200 MHz will be necessary; however, a signal having this type of broad band cannot be reproduced by means of the apparatuses disclosed in the documents described above.

Furthermore, the magnetic sensor of the magnetic reproduction apparatuses disclosed in the documents described above has a core-type structure in which a coil is wound around a magnetic material, as was the case in the conventional ring-type inductive magnetic head, so that it is necessary that a coil be wound around a magnetic material, and thus problems are present in that the structure and execution of the parts becomes complex, the stray capacity becomes large, and high frequency operation is difficult.

SUMMARY OF THE INVENTION

Accordingly, it is an object of the present invention to provide a magnetic field sensing method and apparatus which are capable of magnetic field polarity sensing having a high SN ratio and measurement accuracy, and employ a simple component structure.

Accordingly, the present invention is characterized in that a magnetic sensor comprising a conductor and at least one magnetic material provided on any of the faces of the conductor is disposed in the vicinity of an external magnetic field which is to be sensed, a high frequency current is supplied to the conductor, and based on the changes in the impedance in the conductor in accordance with this external magnetic field, the external magnetic field is sensed.

Furthermore, the present invention is characterized in that a magnetic sensor, comprising a conductor, and at least one magnetic material which is provided so as to enclose the periphery of the conductor, and is provided with a gap at a portion of the magnetic circuit formed by this magnetic material which faces an external magnetic field to be sensed, is disposed in the vicinity of an external magnetic field which is to be sensed, a high frequency current is supplied to the conductor, and based on changes in the impedance of the conductor as a result of the external magnetic field, the external magnetic field is sensed.

Furthermore, the present invention is characterized in that a ring-type inductive magnetic sensor, comprising a magnetic core, a coil wound around this magnetic core, and at least one conductor which is provided within the magnetic core, is disposed in the vicinity of an external magnetic field which is to be sensed, a high frequency current is supplied to the conductor, and based on changes in the impedance of the conductor resulting from the external magnetic field, the external magnetic field is sensed.

Furthermore, the present invention is characterized in being provided with: a magnetic sensor, comprising a conductor, and at least one magnetic material provided on any of the surfaces of the conductor; a high frequency generator which supplies a high frequency current to the conductor; and a wave detector which detects the changes in voltage amplitude at both ends of the conductor.

Furthermore, the present invention is characterized in being provided with: a magnetic sensor, comprising a conductor, and at least one magnetic material which is provided so as to enclose the periphery of the conductor and which is provided with a gap at the portion of the magnetic circuit formed by this magnetic material which faces the external magnetic field which is to be sensed; a high frequency generator which supplies a high frequency current to the conductor; and a wave detector which detects changes in the voltage amplitude at both ends of the conductor.

In addition, the present invention is characterized in being provided with: a ring-type inductive magnetic sensor, comprising a magnetic core, a coil wound around this magnetic core, and at least one conductor which is provided within the magnetic core; a high frequency generator which supplies high frequency current to the conductor; and a wave detector which detects the changes in voltage amplitude at both ends of the conductor.

In accordance with the present invention, it is possible to sense the polarity of a magnetic field with high sensitivity, a high SN ratio, and high measurement accuracy, and by employing a simple component structure. That is to say, by means of the present invention, impedance exhibits a large dependency on the external magnetic field, so that this possesses advantages in that the SN ratio and sensitivity are extremely high. Accordingly, the present invention exhibits superior usefulness with respect to the increase in recording density of magnetic recording.

Furthermore, the conductor, or the coil, is combined with a conductor for DC bias, so that in the case in which a magnetic field polarity sensing function is to be provided, this is advantageous in that the component structure is simple. Furthermore, in comparison with the giant magnetoresistance effect, room temperatures and low magnetic field response are possible, and there is small hysteresis, so that there are advantages in that the measurement system is simple, the sensitivity is high, and the reliability is high.

Furthermore, the changes in the impedance are converted into a voltage by means of the four-terminal method, so that broad band characteristics are possessed, and stable reproduction becomes possible even with respect to high frequency signals, and the invention thus exhibits even more superior applicability with respect to an increase in recording density in magnetic recording.

BRIEF DESCRIPTION OF THE DRAWINGS

FIG. 17A shows, in schematic form, another structure of the magnetic sensor 70.

FIG. 17B shows, in schematic form, another structure of the magnetic sensor 70.

FIG. 17C shows, in schematic form, another structure of the magnetic sensor 70.

FIG. 17D shows, in schematic form, another structure of the magnetic sensor 70.

FIG. 17E shows, in schematic form, another structure of the magnetic sensor 70.

FIG. 17F shows, in schematic form, another structure of the magnetic sensor 70.

FIG. 17G shows, in schematic form, another structure of the magnetic sensor 70.

FIG. 17H shows, in schematic form, another structure of the magnetic sensor 70.

FIG. 23 shows an example of the dependency characteristics of the peak-to-peak voltage V between electrodes 79a and 79b, with respect to an external magnetic field $H_{EX}$, in a magnetic field sensing apparatus in accordance with the Third Embodiment of the present invention.

DETAILED DESCRIPTION OF THE INVENTION

Hereinbelow, embodiments of the present invention will be explained with reference to the Figures.

FIRST EMBODIMENT

Figure 1A:
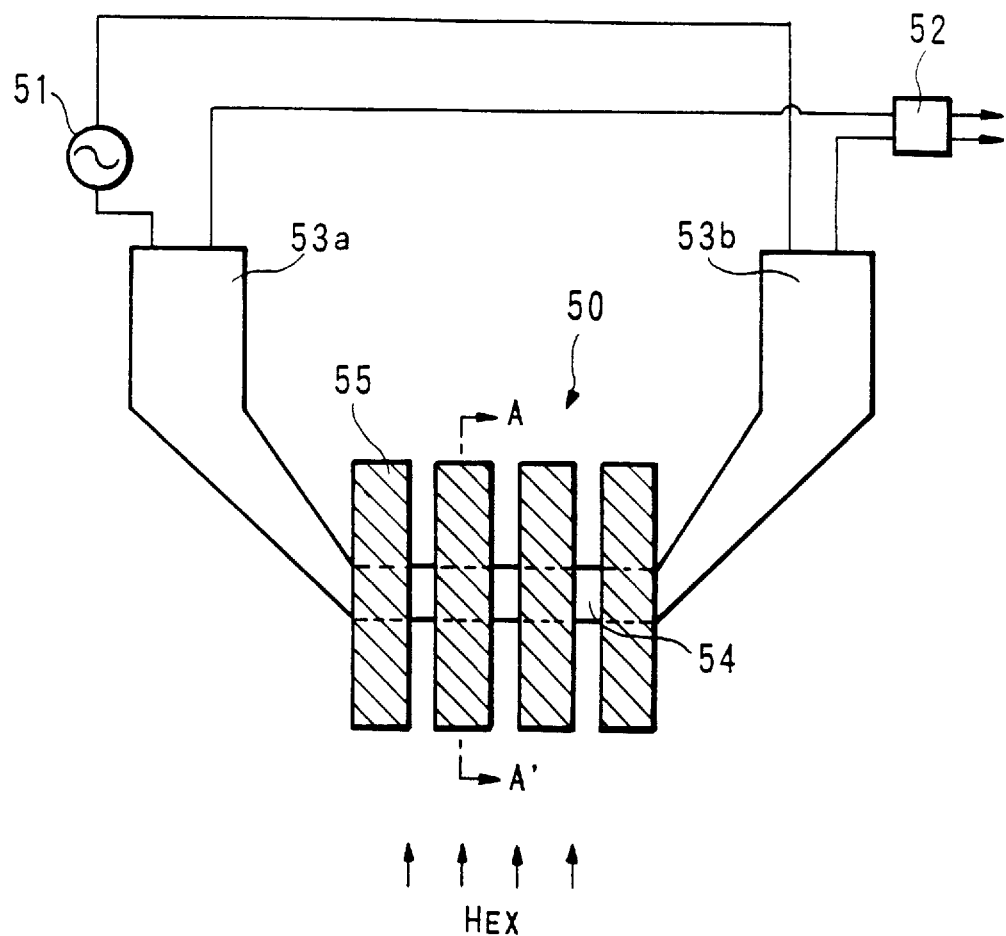
FIG. 1A is a front view showing, in schematic format, the structure of a magnetic field sensing apparatus in accordance with a First Embodiment of the present invention.

FIG. 1A shows, in schematic form, the structure of a magnetic field sensing apparatus in accordance with a First Embodiment of the present invention.

Figure 1B:
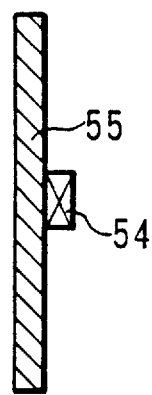
FIG. 1B is a cross sectional view taken along the line A–A' in FIG. 1A.

In FIG. 1A, the magnetic field sensing apparatus comprises a magnetic sensor 50, a high frequency generator 51, and a wave detector 52, which converts changes in voltage amplitude to changes in voltage. In magnetic sensor 50, a plurality of magnetic materials 55 are formed on the surface of a conductor 54, possessing a pair of electrodes 53a and 53b at the ends thereof. As explained below when a DC bias current flows through conductor 54, wave detector 52 functions to cut the DC current in order to cancel the DC bias current from the signal to be detected during the detection process. FIG. 1B is a cross sectional view taken along the line A–A' in FIG. 1A. In FIG. 1B, the magnetic materials 55 are provided directly on the conductor 54. The impedance Z(f) at a given frequency f of the magnetic sensor 50 having this type of structure is expressed by Formula (2) below.

$$Z(f)=Z_0(f)+\Delta Z_{mag}(f) \tag{2}$$

In Formula (2), $Z_0(f)$ represents the impedance originating in conductor 54 itself, while $\Delta Z_{mag}(f)$ represents the amount of increase in the impedance in conductor 54 resulting from the existence of magnetic materials 55 on the surface thereof; this arises as a result of the reflection and absorption of the high frequency magnetic field generated in magnetic materials 55 by the high frequency current supplied to conductor 54 by high frequency generator 51. In this case the term "high frequency magnetic field" refers to a high frequency magnetic field which is generated circumferentially around conductor 54 when a high frequency current is supplied to conductor 54 from generator 51. This high frequency magnetic field is reflected and absorbed in magnetic materials 55, resulting in the generation of impedance $\Delta Z_{mag}(f)$. The frequency of this high frequency magnetic field is not especially restricted. Impedance $Z_0(f)$ exhibits almost no dependence on frequency within a range of frequencies less than or equal to a few GHz, and maintains a constant value. The amount of increase $\Delta Z_{mag}(f)$ in the impedance has the relationship to the relative magnetic permeability $\mu_r(f)$ of magnetic materials 55 which is shown in Formula (3) below.

$$\Delta Z_{mag}(f) \propto f \mu_r(f) \qquad (3)$$

Here, $$\mu_r(f) = \mu'_r(f) - j\mu''_r(f) \qquad (4).$$

where $\mu'_r(f)$ is the real part of the relative permeability and $\mu''_r(f)$ is the imaginary part of the relative permeability.

When the strength of the external magnetic field $H_{EX}$ which is applied to the magnetic materials 55 is increased, the value of the relative magnetic permeability $\mu_r(f)$ is reduced, and when the strength of the external magnetic field $H_{EX}$ reaches a sufficiently large value in comparison with the anisotropic magnetic field of magnetic materials 55, the value of the relative magnetic permeability $\mu_r(f)$ finally reaches 0. The SN ratio of the magnetic sensor 50 is expressed by the voltage change ratio $\Delta V/V(0)$ of the peak-to-peak voltage between electrodes 53a and 53b. This voltage change ratio $\Delta V/V(0)$ is expressed by Formula (5) below.

$$\frac{\Delta V}{V(0)} = \frac{V(0) - V(H)}{V(0)} = \frac{\Delta Z_{mag}(f)}{[Z_0(f) + \Delta Z_{mag}(f)]} \qquad (5)$$

In formula (5), $V(0)$ represents the peak-to-peak voltage between electrodes 53a and 53b when an external magnetic field $H_{EX}$ is not applied, while $V(H)$ indicates the peak-to-peak voltage between electrodes 53a and 53b when magnetic materials 55 are saturated; $\Delta V$ is given by $[V(0)-V(H)]$. In Formula (5), the value of impedance $Z_0(f)$ is small, and the amount of increase $\Delta Z_{mag}(f)$ in the impedance becomes a very large value in high frequency regions, so that magnetic sensor 50 possesses an extremely large SN ratio. Furthermore, it is possible to select a material for use as magnetic materials 55 which has a low anisotropic magnetic field and has small hysteresis, so that it is possible to increase sensitivity and sensing accuracy.

In this way, the magnetic sensor 50 has the following operational principle: when a high frequency current is applied to conductor 54 by high frequency generator 51 through the medium of electrodes 53a and 53b, the impedance of the conductor, 54 changes in accordance with the external magnetic field $H_{EX}$, and based on this, the changes in the external magnetic field $H_{EX}$ are sensed as changes in voltage amplitude. These changes in voltage amplitude are converted into changes in voltage by means of wave detector 52. Even if a plurality of pairs of electrodes 53a and 53b are provided for high frequency current application and voltage measurement, similar effects can be obtained. Furthermore, similar effects can be obtained even if there is only one magnetic material 55.

Figure 2A:
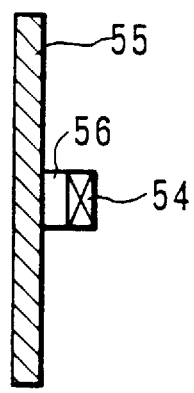
FIG. 2A is a cross sectional view showing, in schematic form, another structure of the magnetic sensor 50.
Figure 2B:
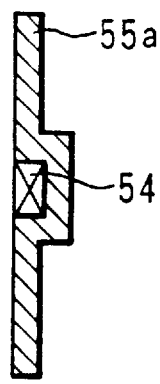
FIG. 2B is a cross sectional view showing, in schematic form, another structure of the magnetic sensor 50.
Figure 2C:
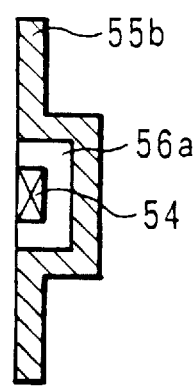
FIG. 2C is a cross sectional view showing, in schematic form, another structure of the magnetic sensor 50.
Figure 2D:
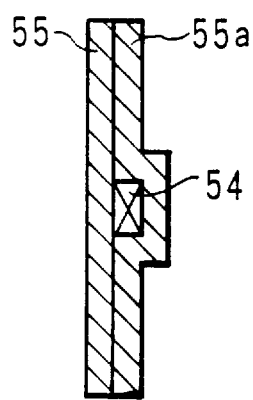
FIG. 2D is a cross sectional view showing, in schematic form, another structure of the magnetic sensor 50.
Figure 2E:
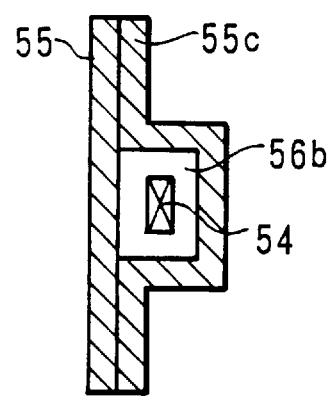
FIG. 2E is a cross sectional view showing, in schematic form, another structure of the magnetic sensor 50.
Figure 2F:
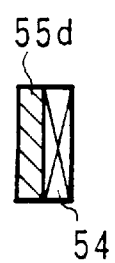
FIG. 2F is a cross sectional view showing, in schematic form, another structure of the magnetic sensor 50.
Figure 2G:
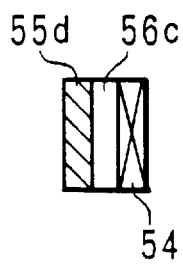
FIG. 2G is a cross sectional view showing, in schematic form, another structure of the magnetic sensor 50.
Figure 2H:
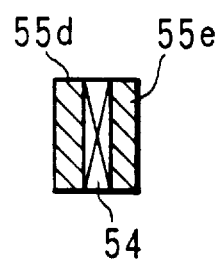
FIG. 2H is a cross sectional view showing, in schematic form, another structure of the magnetic sensor 50.
Figure 2I:
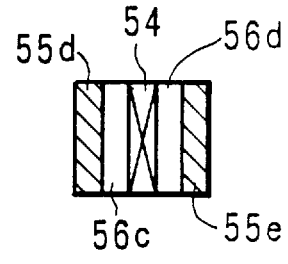
FIG. 2I is a cross sectional view showing, in schematic form, another structure of the magnetic sensor 50.

FIGS. 2A–2I show, in schematic form, other structures of the magnetic sensor 50; they correspond to cross sectional views taken along a line A–A' in FIG. 1A, respectively. The magnetic materials may be formed directly on the surface of the conductor, or through the medium of a non-magnetic insulator; FIG. 2A shows a structure in which magnetic material 55 is provided on conductor 54 through the medium of non-magnetic insulator 56. FIG. 2B shows a structure in which magnetic material 55a is provided directly on the surface of conductor 54 so as to cover a portion of conductor 54 other than the upper surface thereof. FIG. 2C shows a structure in which magnetic material 55b is provided so as to cover a portion of conductor 54 other than the upper surface thereof, through the medium of a non-magnetic insulator 56a. FIG. 2D shows a structure in which magnetic materials 55 and 55a are provided directly on surfaces of conductor 54 so as to enclose the periphery of conductor 54. FIG. 2E shows a structure in which magnetic materials 55 and 55c are provided so as to enclose the periphery of conductor 54 through the medium of a non-magnetic insulator 56b. FIG. 2F shows a structure in which a magnetic material 55d having a width identical to that of conductor 54 is provided directly on conductor 54. FIG. 2G shows a structure in which magnetic material 55d is provided on conductor 54 through the medium of a non-magnetic insulator 56c. FIG. 2H shows a structure in which magnetic materials 55d and 55e are provided directly on surfaces of conductor 54 so as to be present on both sides thereof. FIG. 2I shows a structure in which magnetic materials 55d and 55e are provided so as to be present on both sides of conductor 54 through the medium of non-magnetic insulators 56c and 56d. The magnetic materials may be provided directly on surfaces of the conductor, or may be provided through the medium of non-magnetic insulators; any number of variations thereof are possible in addition to those shown in FIG. 2A–2I.

By constructing the magnetic sensor 50 as shown in FIGS. 2D, 2E, 2H, and 2I, it is possible to avoid the influence of the demagnetizing field $H_d$ of magnetic materials 55, 55a, 55c, 55d, and 55e, with respect to the high frequency magnetic field generated by conductor 54, and it is possible to restrict magnetic flux leakage, and to obtain a large SN ratio.

Figure 3:
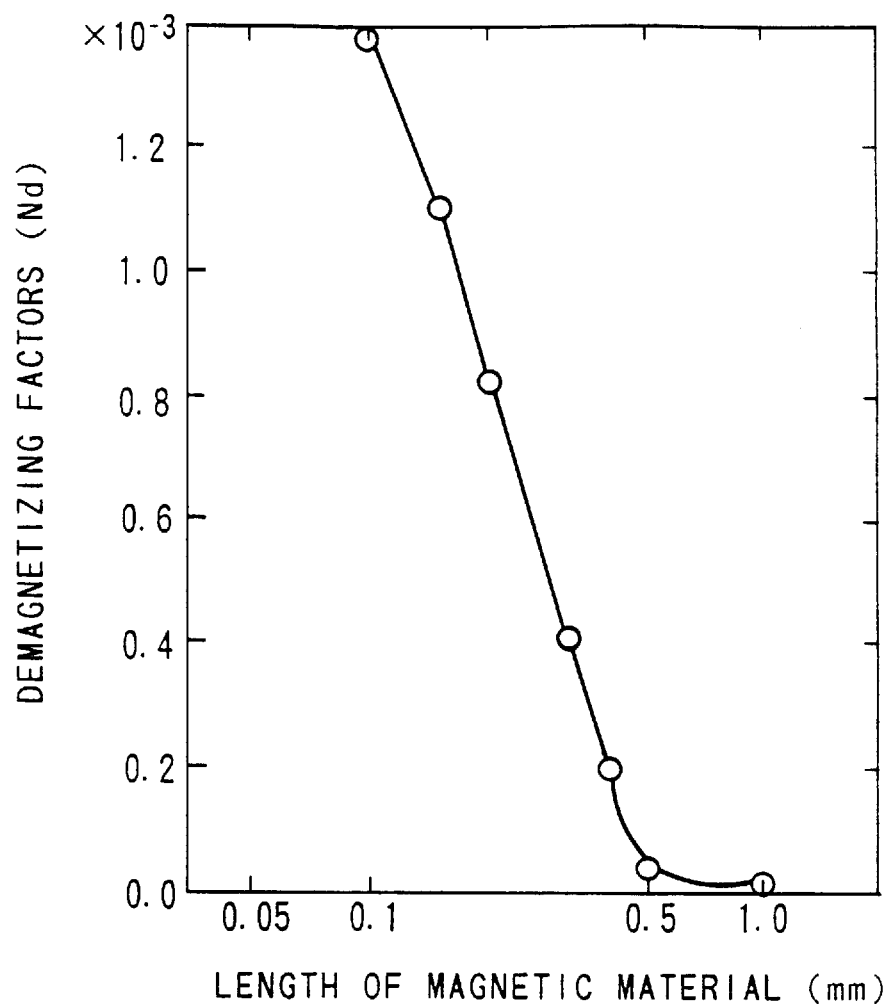
FIG. 3 shows an example of the dependence of an demagnetizing factor $N_d$ on the shape of the magnetic material in a magnetic sensor 50 in accordance with the First Embodiment of the present invention.

In order to avoid the influence of the demagnetizing field $H_d$ of magnetic materials 55 and 55a–55e, with respect to external magnetic field $H_{EX}$, and to increase the sensitivity, it is advantageous, as shown in FIG. 1A, that the shape of magnetic materials 55 be that of rectangular plates, the longitudinal direction of which is parallel to the external magnetic field $H_{EX}$. An example of the dependence of demagnetizing factor $N_d$ on the shape of the magnetic materials is shown in FIG. 3. In the example shown in FIG. 3, the width of the magnetic materials is 10 $\mu$m, and the thickness thereof is 1.5 $\mu$m. The relationship between the demagnetizing field $H_d$ and the demagnetizing factor $N_d$ is shown in Formula (6).

$$H_d = N_d \cdot 4\pi M s \qquad (6)$$

In Formula (6), $4\pi Ms$ represents the saturation magnetization. FIG. 3 indicates that in order to completely avoid the influence of the demagnetizing field $H_d$, it is necessary to set the length of the magnetic materials 55 to 500 $\mu$m or more. That is to say, it can be seen that a rectangular plate shape is preferable.

Figure 4:
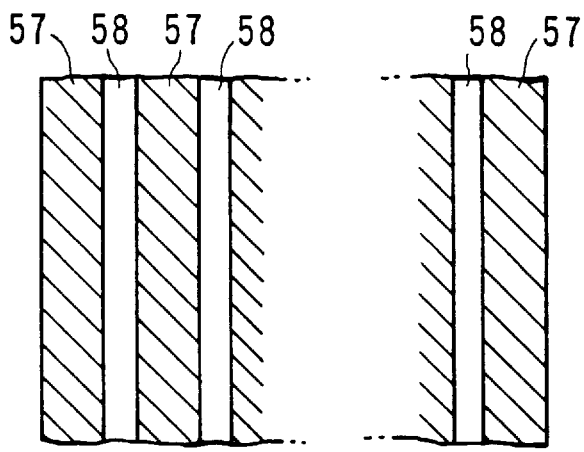
FIG. 4 is a cross sectional view showing another structure of the magnetic material 55 of the magnetic sensor 50.

In the magnetic sensor 50 described above, by means of making the film thickness of the conductor 54 and the magnetic materials 55 thick, it is possible to reduce the impedance $Z_0$, and to increase the amount of increase $\Delta Z_{mag}$ in the impedance, so that by means of appropriately setting these film thicknesses, it is possible to further increase the sensitivity and the SN ratio. In this case, when the film thickness of the magnetic materials 55 is made thick, as a result of the skin effect, the effective volume of the magnetic materials 55 is decreased. In order to avoid the skin effect, it is effective to employ a multi-layered structure, as is shown in FIG. 4, in which magnetic layers 57 and non-magnetic insulator layers 58 are alternately layered, as the cross sectional structure of the magnetic materials 55. In this case, it is effective to set the film thickness of the magnetic layers 57 so as to be thinner than the skin depth, and furthermore, it is effective to set the thickness of the non-magnetic insulator layers 58 to at least a thickness which is capable of maintaining electrical insulation between two magnetic layers 57. Here, the skin depth δ is the depth from the surface to which a high frequency electromagnetic wave is able to penetrate the magnetic material, and is expressed by the Formula (7) below, using the electrical resistivity $\rho_m$ of the magnetic materials, the frequency f, the static relative magnetic permeability $\mu_r'(0)$, and the relative magnetic permeability $\mu_0$ for a vacuum.

$$\delta = \sqrt{\frac{2\rho m}{2\pi f \cdot \mu' r(0) \cdot \mu 0}} \quad (7)$$

Hereinbelow, a magnetic field sensing method and apparatus in accordance with a First Embodiment will be concretely explained.

First, with respect to the shape of magnetic sensor 50, the shapes shown in FIG. 1A and FIG. 2D were selected, and furthermore, the structure shown in FIG. 4 was selected as that of the magnetic materials, Cu having a thickness of 2 μm was used as conductor 54, a NiFe alloy having a film thickness of 0.05 μm was used as the magnetic layer 57, $SiO_2$ having a thickness of 0.1 μm was used as the non-magnetic insulator layer 58, and the total film thickness of the magnetic materials 55 and 55a was 1.5 μm individually. Furthermore, the width of conductor 54 was set to 10 μm, the length thereof was set to 100 μm, the width of the magnetic materials 55 and 55a was set to 10 μm, and the length thereof was set to 1000 μm, and the number of magnetic materials 55 and 55a was set to 6 individually. The direction of the short side of the magnetic materials 55 and 55a was the easy axis direction of magnetic anisotropy. The ion-beam sputtering method and the photolithographic method were used for film formation and processing, respectively, and a uniaxial anisotropy magnetic field was given by means of film formation in a magnetic field.

With respect to the magnetic sensor 50 having the structure described above, an example is shown in FIG. 5 of the dependency of the peak-to-peak voltage change ratio ΔV/V (0) between electrodes 53a and 53b, with respect to frequency (f), in the case in which a high frequency current is caused to flow between electrodes 53a and 53b by high frequency generator 51. The measurement was carried out at room temperatures. Here, V(0) represents the peak-to-peak voltage between electrodes 53a and 53b when an external magnetic field $H_{EX}$ is not applied, V(H) represents the peak-to-peak voltage between electrodes 53a and 53b when a magnetic field of 100 Oe, which is sufficiently larger than the anisotropic magnetic field of 5 Oe of the NiFe alloy, is applied as external magnetic field $H_{EX}$, and ΔV represents V(0)−V(H); the voltage change ratio Δv/v(0) corresponds to the SN ratio of magnetic sensor 50. voltage change ratio ΔV/V(0) has a large value within a range of 60–70% when the frequency of the high frequency current is within a range from a few hundred MHz to the vicinity of 1 GHz. The reason that the voltage change ratio ΔV/V(0) becomes large in this frequency band is that this frequency band coincides with the magnetic resonance frequency, 600 MHz–1 GHz, of NiFe alloy. An example of the dependency of the peak-to-peak voltage V between electrodes 53a and 53b at 800 MHz with respect to an external magnetic field $H_{EX}$ is shown in FIG. 6. As can be seen from FIG. 6, the peak-to-peak voltage V between electrodes 53a and 53b decreases greatly at approximately anisotropic magnetic field of 5 Oe of the NiFe alloy, and reaches an essentially constant value at 20 Oe.

As described above, in the structural example described above, a large voltage change ratio within a range of 60–70% is obtained, and furthermore, a large voltage change is produced by means of small external magnetic fields $H_{EX}$ of a few Oe, so that it can be seen that the sensitivity is high. Hysteresis was not observed even when increases and decreases in the strength of the external magnetic field $H_{EX}$ were repeated.

Figure 5:
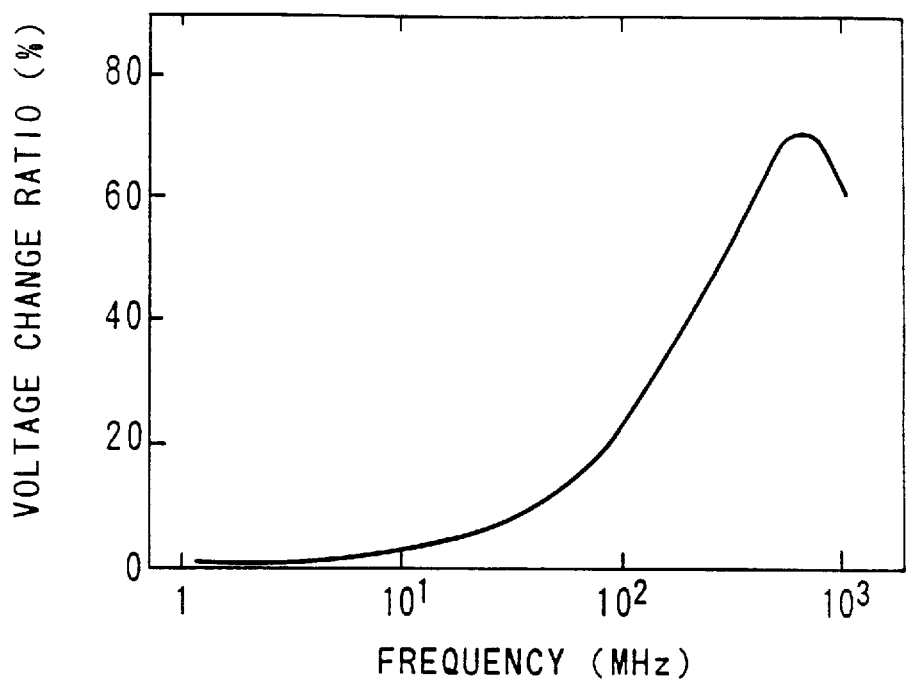
FIG. 5 shows an example of the dependency of the voltage change ratio $\Delta V/V(0)$ with respect to the frequency (f) in a magnetic field sensing apparatus in accordance with the First Embodiment of the present invention.
Figure 6:
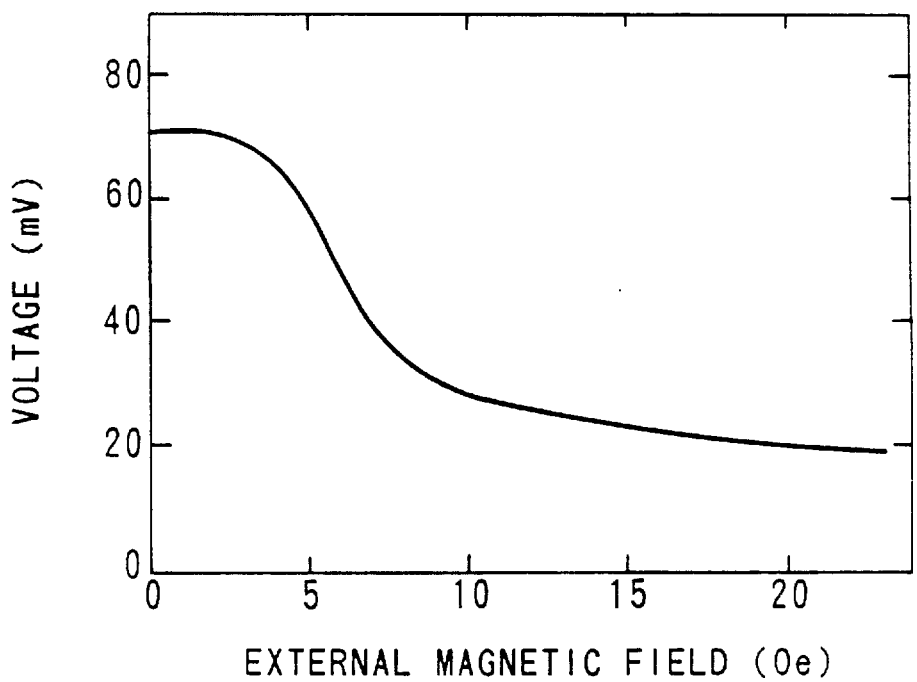
FIG. 6 shows an example of the dependency of the peak-to-peak voltage V between electrodes 53a and 53b with respect to the external magnetic field $H_{EX}$ in a magnetic field sensing apparatus in accordance with the First Embodiment of the present invention.

Furthermore, as can be seen from FIG. 5, the voltage change ratio ΔV/V(0) reaches a maximum value when the frequency of the high frequency current is set in the vicinity of the magnetic resonance frequency of the magnetic material 55. Accordingly, in order to obtain a high SN ratio and high sensitivity, the operation of the magnetic sensor 50 in the vicinity of this magnetic resonance frequency is effective.

Furthermore, with the magnetic sensor 50 having a structure in accordance with the First Embodiment, it is possible to cause a DC bias current to flow to conductor 54, to move the operational point on the V-H curve (see FIG. 6) by means of the bias magnetic field produced by the DC bias current at the position of the magnetic material 55, and thus to sense the polarity of the external magnetic field $H_{EX}$, and it is possible to increase the sensitivity by moving the operational point to the point at which the slope of the V-H curve reaches a maximum value. At this time, a DC bias current is provided to conductor 54 in addition to the high frequency current generated by high frequency generator 51. Conductor 54 functions as a DC bias conductor in addition to its function as a conductor for supplying a high frequency current. Consequently, there is no need to install a separate DC bias conductor as a part for supplying a DC bias. Thus, the number of parts is reduced and the component structure is simplified. In addition to the functions of wave detection and demodulation, wave detector 52 must have the function of cutting the DC current during the process of wave detection in order to cancel the pre-installed DC bias current from the signal to be detected.

When the magnetic sensor 50 described above is formed by means of a thin film, examples of the methods which may be used as the film formation method thereof include, in addition to the ion-beam sputtering method, the RF and DC sputtering method, the RF and DC magnetron sputtering method, the electroplating method, and the vapor deposition method, and the like; it is possible to achieve similar effects using any of these methods.

Examples of materials usable in the magnetic layer 57 include materials in which one or a plurality of elements selected from a group containing Fe, Co, Ni, Zr, Nb, Y, Hf, Ti, Mo, W, Ta, Si, B, and Re are added to Fe, Co, and Ni; examples of materials usable in the non-magnetic insulator layer 58 include, for example, $SiO_2$, AlN, $Al_2O_3$, BN, TiN, SiC, polyethylene naphthalate (PEN), polyethylene terephthalate (PET), polyimide, captone, photoresist, and the like, and examples of materials usable as conductor 54 include, for example, Cu, Al, Ag, Au, Pt, Sn, Cr, Zn, and In; similar effects may be obtained when any of these is employed.

As is clear from the effects above, the magnetic sensor in accordance with the First Embodiment has a SN ratio, sensitivity, and measurement accuracy which are high in comparison with the conventional MR sensor, and furthermore, when a magnetic field polarity sensing function is provided, the component structure is simple, and improvements are obtainable such that undesirable variation in the various functions of the magnetic sensor are restricted, and it is possible to increase the reliability of the magnetic sensor.

SECOND EMBODIMENT

Figure 7A:
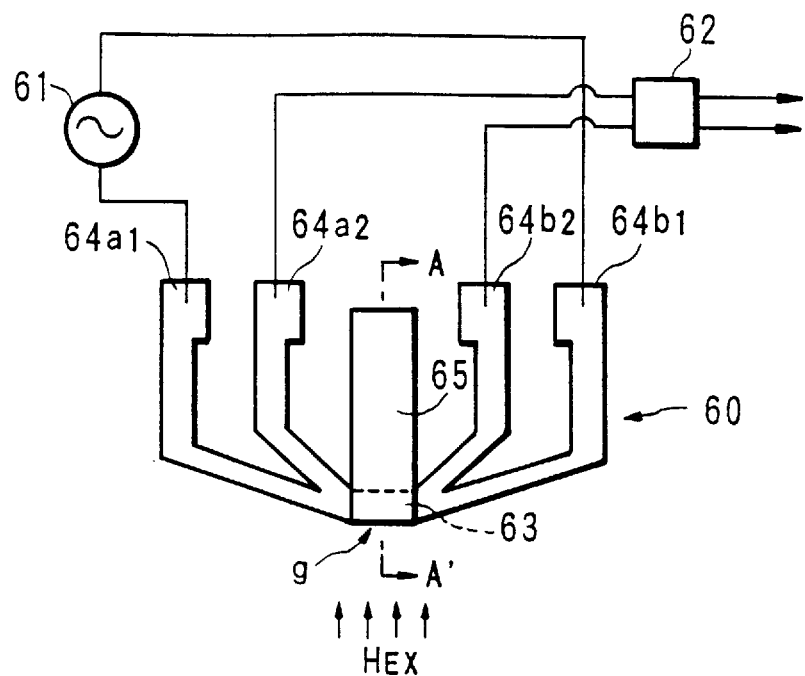
FIG. 7A shows, in schematic form, the structure of a magnetic field sensing apparatus in accordance with the Second Embodiment of the present invention.
Figure 7B:
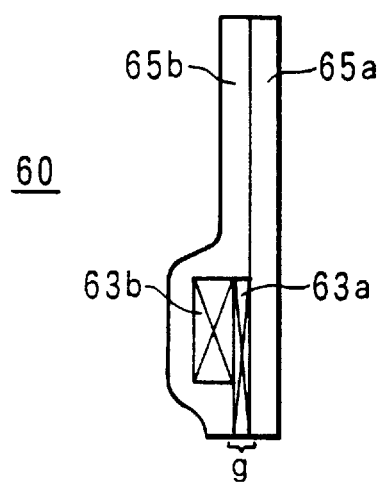
FIG. 7B is a cross sectional view taken along the line A–A' in FIG. 7A.

FIG. 7A shows, in schematic form, the structure of a magnetic field sensing apparatus in accordance with the Second Embodiment of the present invention, and FIG. 7B is a cross sectional view taken along the line A—A' in FIG. 7A. In FIG. 7A, the magnetic sensing apparatus comprises a magnetic sensor 60, a high frequency generator 61, and a wave detector 62. The magnetic sensor 60 comprises a conductor 63, electrodes $64a_1$, $64a_2$, $64b_1$, and $64b_2$, and magnetic material 65. As shown in FIG. 7B, conductor 63 has a structure in which a conductor 63b is formed on a conductor 63a, and electrodes $64a_2$, $64b_2$, and electrodes $64a_1$, and $64b_1$ are connected to both ends of conductor 63a, or conductor 63b. As shown in FIG. 7B, magnetic material 65 comprises magnetic materials 65a and 65b, and magnetic materials 65a and 65b are formed directly on the surface of conductors 63a and 63b so as to enclose the periphery of conductors 63a and 63b. Magnetic sensor 60 possesses a gap g in a portion of the magnetic circuit thereof, and the gap g is formed by means of interposing conductor 63a between magnetic material 65a and magnetic material 65b.

Figure 8A:
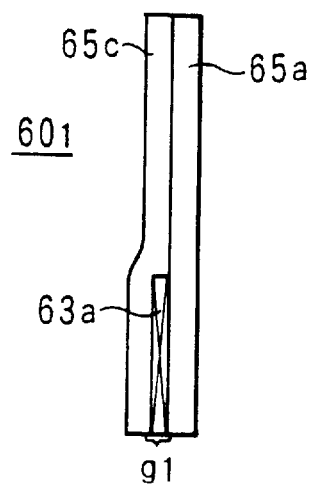
FIG. 8A shows, in schematic form, the structure of a magnetic sensor $60_1$ which is employed in the magnetic field sensing apparatus in accordance with the Second Embodiment of the present invention.

FIGS. 8A–8E show, in schematic form, other structures of magnetic sensors $60_1$–$60_5$ which are employed in the magnetic field sensing apparatus in accordance with the Second Embodiment; these correspond to cross sectional views taken along the line A–A' in FIG. 7A. In FIG. 8A, magnetic sensor $60_1$ has a structure in which magnetic materials 65a and 65c are disposed directly on the surface of conductor 63a so as to enclose the periphery of conductor 63a. In magnetic sensor $60_1$, a gap $g_1$ is provided in a portion of the magnetic circuit thereof, and the gap $g_1$ is formed by interposing conductor 63a between magnetic material 65a and magnetic material 65c.

Figure 8B:
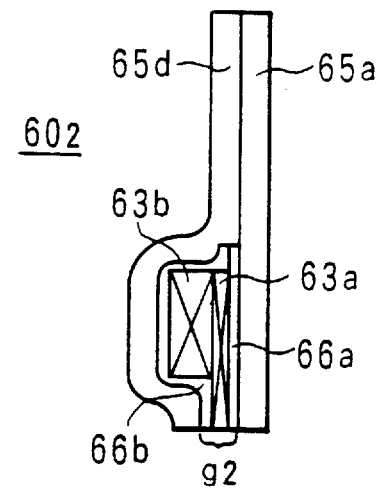
FIG. 8B shows, in schematic form, the structure of a magnetic sensor $60_2$ which is employed in the magnetic field sensing apparatus in accordance with the Second Embodiment of the present invention.

In FIG. 8B, magnetic sensor $60_2$ has a structure in which conductor 63b is formed on conductor 63a, and magnetic materials 65a and 65d are disposed on the surfaces of conductors 63a and 63b through the medium of non-magnetic insulators 66a and 66b so as to enclose the periphery of these conductors 63a and 63b. Magnetic sensor $60_2$ possesses a gap $g_2$ in a portion of the magnetic circuit thereof, and the gap $g_2$ is formed by interposing conductor 63a and non-magnetic insulators 66a and 66b between magnetic material 65a and magnetic material 65d.

Figures 8C, 8D:
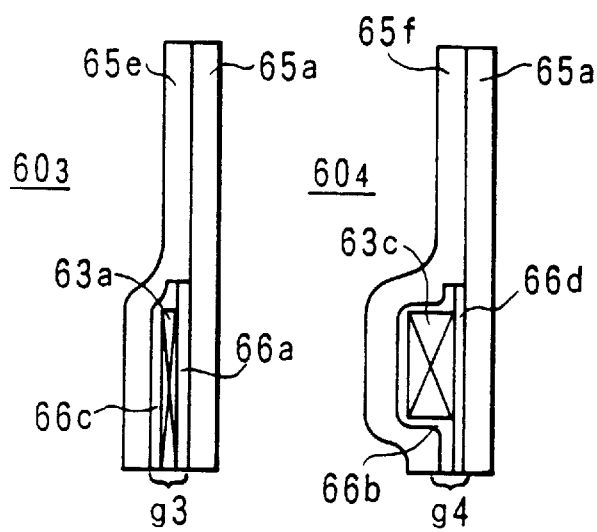
FIG. 8C shows, in schematic form, the structure of a magnetic sensor $60_3$ which is employed in the magnetic field sensing apparatus in accordance with the Second Embodiment of the present invention.
FIG. 8D shows, in schematic form, the structure of a magnetic sensor $60_4$ which is employed in the magnetic field sensing apparatus in accordance with the Second Embodiment of the present invention.

In FIG. 8C, magnetic sensor $60_3$ has a structure in which magnetic materials 65a and 65e are disposed on the surface of a conductor 63a through the medium of non-magnetic insulators 66a and 66c so as to enclose the periphery of conductor 63a. Magnetic sensor $60_3$ is provided with a gap $g_3$ in a portion of the magnetic circuit thereof, and gap $g_3$ is formed by interposing conductor 63a and non-magnetic insulators 66a and 66c between magnetic material 65a and magnetic material 65e.

In FIG. 8D, magnetic sensor $60_4$ has a structure in which magnetic materials 65a and 65f are disposed on the surface of conductor 63c through the medium of non-magnetic insulators 66b and 66d so as to enclose the periphery of conductor 63c. Magnetic sensor $60_4$ is provided with a gap $g_4$ in a portion of the magnetic circuit thereof, and gap $g_4$ is formed by interposing non-magnetic insulators 66b and 66d between magnetic material 65a and magnetic material 65f.

Figure 8E:
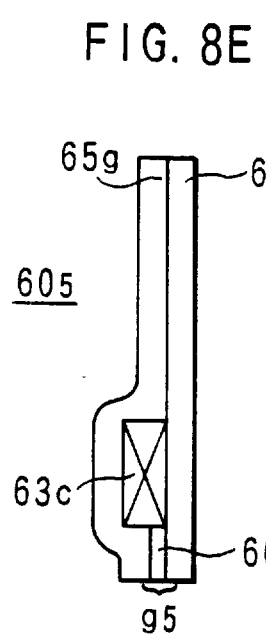
FIG. 8E shows, in schematic form, the structure of a magnetic sensor $60_5$ which is employed in the magnetic field sensing apparatus in accordance with the Second Embodiment of the present invention.

In FIG. 8E, magnetic sensor $60_5$ has a structure in which magnetic materials 65a and 65g are disposed directly on the surface of conductor 63c so as to enclose the periphery of conductor 63c, and a gap $g_5$ is provided in a portion of the magnetic circuit thereof by means of interposing non-magnetic insulator 66e between magnetic material 65a and magnetic material 65g.

Next, the operation of the magnetic field sensing apparatus in accordance with the Second Embodiment will be explained with reference to FIG. 7A and FIG. 9. First, in the recording process, a current corresponding to data which are to be recorded is passed through conductor 63a or 63b, and magnetic materials 65a and 65b are magnetized, and thereby, the magnetic recording medium 67 (see FIG. 9) is magnetized by means of the leakage magnetic field from gap g, and the signal is recorded.

In the reproducing process, the changes in the external magnetic field $H_{EX}$ are converted to changes in impedance in conductor 63, based on changes in the relative magnetic permeability of magnetic materials 65a and 65b, and these changes in impedance are converted into changes in voltage amplitude by the four-terminal method, and reproduction is conducted; That is to say, the high frequency current having a frequency f which is generated by the high frequency generator 61 is applied between electrodes $64a_1$ and $64b_1$, and thereby, when a high frequency current having a frequency f is supplied to conductors 63a and 63b, the high frequency magnetic field generated based on this high frequency current is reflected and absorbed by magnetic materials 65a and 65b, so that the impedance Z(f) of magnetic sensor 60 at a frequency f is expressed by the Formula (2) shown above.

The amount of increase $\Delta Z_{mag}$ (f) in the impedance of Formula (2) above has the relationship with the relative magnetic permeability $\mu_r(f)$ of magnetic materials 65a and 65b which is shown in Formula (3) above.

Figure 9:
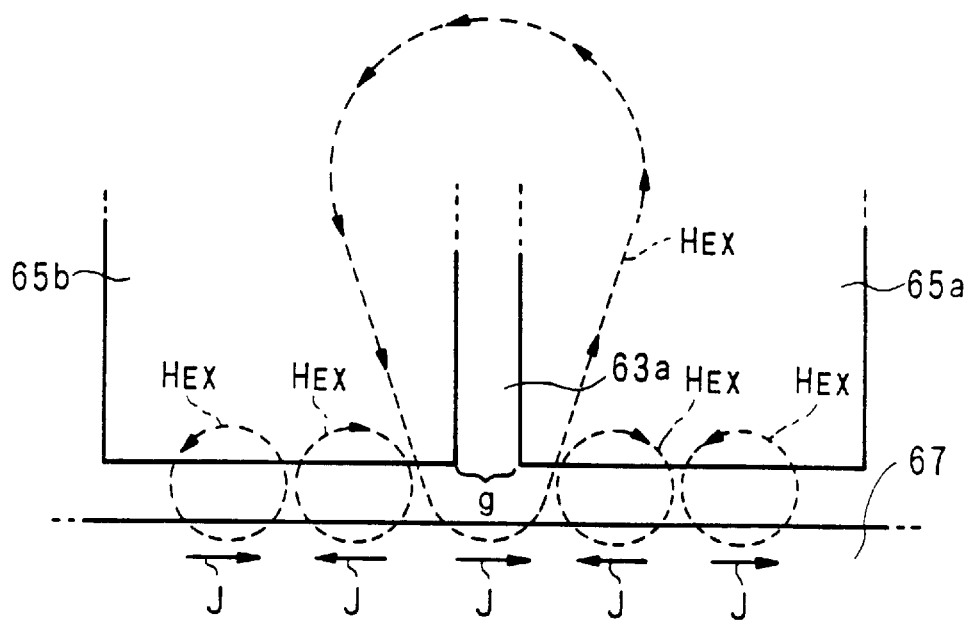
FIG. 9 serves to explain the operation of the magnetic field sensing apparatus in accordance with the Second Embodiment of the present invention.

As shown in FIG. 9, external magnetic field $H_{EX}$ flows into magnetic materials 65a and magnetic material 65b, which are separated by gap g; however, the difference therebetween flows in a path which crosses or encloses the periphery of conductors 63a and 63b, and this magnetizes magnetic materials 65a and 65b based on the direction of the medium magnetization J.

In Formula (3), the value of the relative magnetic permeability $\mu_r(f)$ changes in accordance with the magnetization state of magnetic materials 65a and 65b, so that the recorded signal, or the medium magnetization J, or the external magnetic field $H_{EX}$ becomes a change in the impedance Z(f) of conductor 63a and 63b, and accordingly, becomes a change in the peak-to-peak voltage between electrodes $64a_2$ and $64b_2$, and is reproduced. That is to say, the reproduced signal appears between electrodes $64a_2$ and $64b_2$ in the form of an AM modulation using the high frequency signal from high frequency generator 61 as a carrier. Accordingly, the reproduced signal is extracted by means of the detection of this signal in wave detector 62.

Furthermore, in order to sense the polarity of the external magnetic field $H_{EX}$, a DC bias current is supplied to conductor 63a or conductor 63b, and the DC bias magnetic field generated based on this DC bias current is used. At this time, a DC bias current is provided to conductor 63a or conductor 63b in addition to the high frequency current generated by high frequency generator 61. This eliminates the need for a separate DC bias conductor, which reduces the parts necessary for magnetic sensor 60 and simplifies the structure. In addition to the functions of wave detection and demodulation, wave detector 62 must have the function of cutting the DC current during the process of wave detection in order to cancel the pre-installed DC bias current from the signal to be detected.

The SN ratio of the magnetic sensor 60 of the magnetic field sensing apparatus in accordance with the Second Embodiment discussed above is expressed by the peak-to-peak voltage change ratio $\Delta V/V(0)$ between electrodes $64a_2$ and $64b_2$. This voltage change ratio $\Delta V/V(0)$ is expressed by Formula (5) above. The impedance $Z_0(f)$ is small, and the amount of increase $\Delta Z_{mag}(f)$ in the impedance has an extremely large value in the high frequency region, so that, from Formula (5), the voltage change ratio $\Delta V/V(0)$ acquires a large value, and the SN ratio also acquires a large value.

In particular, in the Second Embodiment, for the reasons given below, it is possible to further enlarge the SN ratio.

The amount of increase $\Delta Z_{mag}(f)$ in the impedance is proportional to the volume or the thickness of the magnetic material 65. In FIG. 9, the spatial resolution (linear recording density) of magnetic sensor 60 depends solely on the length of the gap g, and does not depend on the thickness of the magnetic materials 65a and 65b, so that it is possible to set the thickness of the magnetic materials 65a and 65b to a freely selected value so that the amount of change $\Delta Z_{mag}(f)$ in the impedance becomes sufficiently large. Furthermore, the impedance $Z_0(f)$ is in essentially inverse proportion to the cross sectional area of the conductor 63. When the structure of the magnetic sensor is that shown in FIG. 7B, FIG. 8B, FIG. 8D, or FIG. 8E, then it is possible to freely set the thickness of conductors 63a, 63b, or 63c while keeping the length of the gap g, $g_2$, $g_4$, or $g_5$ short, so that it is possible to reduce the value of the impedance $Z_0(f)$ without reducing the spatial resolution (linear recording density).

As a result of the above, in a magnetic field sensing apparatus in accordance with the Second Embodiment, it is possible to increase the value of the amount of increase $\Delta Z_{mag}(f)$ in the impedance, and to reduce the value of impedance $Z_0(f)$, so that it is possible to further increase the SN ratio. It is possible to select a material which is saturated in a weak magnetic field and which exhibits small hysteresis as the material for magnetic material 65, so that the sensitivity and the signal sensing accuracy are also increased.

Furthermore, in the Second Embodiment, the external magnetic field $H_{EX}$ and the magnetic materials 65a–65g form a closed magnetic path, so that since there is little magnetic flux leakage, even higher sensitivity is possible. Additionally, when the structure of the magnetic sensor is one of those shown in FIG. 7B, FIG. 8A, FIG. 8B, or FIG. 8C, conductors 63a and 63b are exposed in the direction of magnetic recording medium 67 (see FIG. 9), and conductors 63a and 63b are in proximity to magnetic recording medium 67, and thereby, even higher sensitivity becomes possible.

As described above, in order to obtain a high SN ratio, it is effective to increase the thickness of the magnetic materials 65a–65g; however, in high frequency regions, the effective volume of the magnetic material is reduced as a result of the skin effect, and it becomes impossible to obtain a high SN ratio as the thickness of the magnetic materials is increased.

Figure 10:
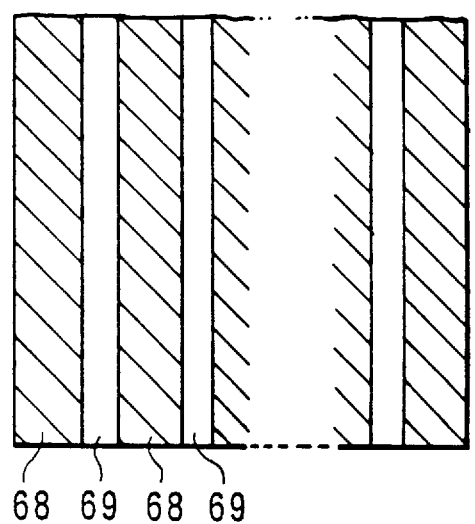
FIG. 10 is a cross sectional view showing another structure of the magnetic material 65 of the magnetic sensor 60.

It is effective, as a method of avoiding the skin effect described above, to employ a multi-layered structure in which, as shown in FIG. 10, magnetic layers 68 and non-magnetic insulator layers 69 are alternately layered, as the cross sectional structure of magnetic materials 65a–65g. In this case, the setting of the thickness of magnetic layers 68 to a e value which is thinner than the skin depth, and the setting of the thickness of the non-magnetic insulator layers 69 to at least a value which will permit the maintenance of electric insulation between magnetic layers 68 and 68, is effective. The skin depth δ is expressed by the Formula (7) above.

Figure 11:
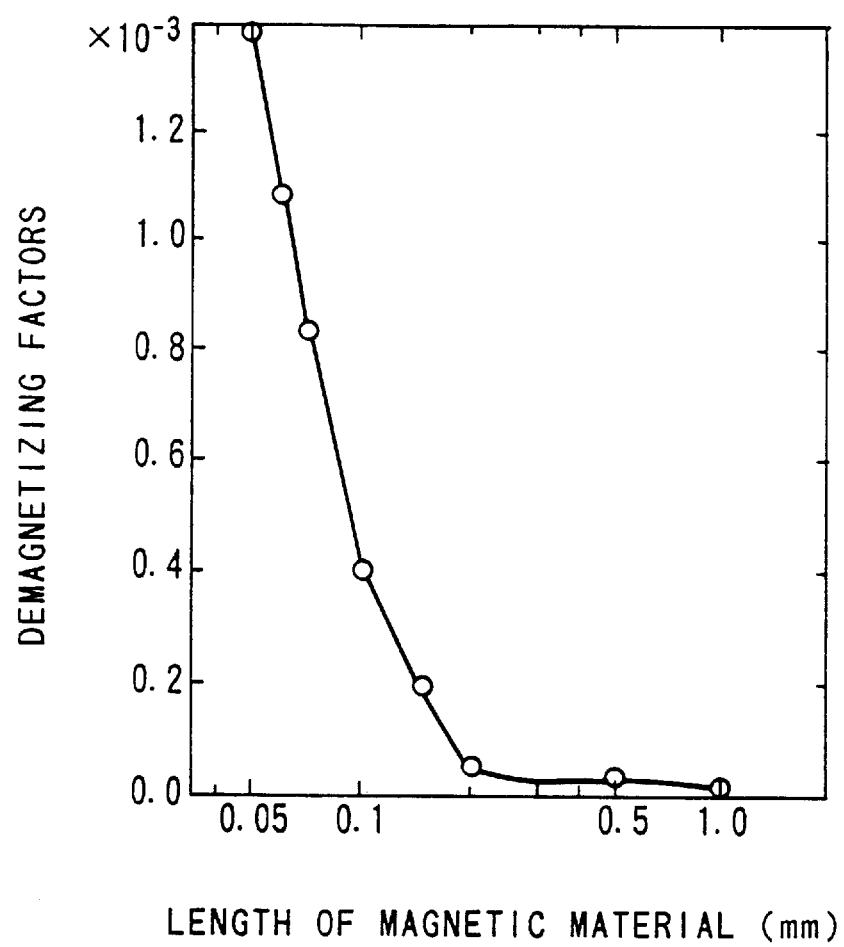
FIG. 11 shows an example of the results of the measurement of the dependency characteristics of the demagnetizing factor of the magnetic material 65 with respect to the shape of the magnetic material.

It is effective, in order to increase the sensitivity with respect to external magnetic fields $H_{EX}$, as shown in FIG. 7A, to set the shape of the magnetic materials 65 to a rectangular plate shape so that the long side thereof is parallel with the external magnetic field $H_{EX}$, and thus to avoid the influence of the demagnetizing field. In FIG. 11, an example is shown of the results of the measurement of the dependency of the demagnetizing factor of a magnetic material 65 comprising NiFe film, with respect to the shape of the magnetic material 65. In the example shown in FIG. 11, the film thickness of the magnetic material 65 was set to 3 μm, the width was set to 5 μm, and the relationship between the long side thereof and the demagnetizing factor is shown. It can be seen from FIG. 11 that when the magnetic material 65 has a long side having a length of 200 μm or greater, it is essentially possible to ignore the effects of the demagnetizing field.

Hereinbelow, a concrete example will be explained. The shapes shown in FIGS. 7A and 7B were selected for the magnetic sensor 60, and the multi-layered structure shown in FIG. 10 was adopted for the magnetic material 65. NiFe alloy was employed in the magnetic layer 68, and the thickness thereof was set to 50 nm, which is sufficiently thinner than the skin depth. SiO$_2$ was employed in the non-magnetic insulator layers 69, and the thickness thereof was set to 50 nm, which is sufficient to guarantee electrical insulation between magnetic layers 68 and 68. The thicknesses of the magnetic materials 65a and 65b were set to 3 μm, and in order to avoid the influence of demagnetizing fields, the width of magnetic materials 65a and 65b was set to 5 μm, and the length thereof was set to 200 μm. A uniaxial anisotropy magnetic field of 3–5 Oe was given to the magnetic materials 65a and 65b so that the direction of the width thereof was the easy axis. Cu was employed in the conductors 63a and 63b, and the width of the conductor 63a was set to 8 μm, the thickness thereof was set to 0.3 μm, and the length thereof was set to 10 μm, while the width of conductor 63b was set to 5 μm, the thickness thereof was set to 0.7 μm, and the length thereof was set to 10 μm, and the length of the gap g was set to 0.3 μm. The ion-beam sputtering method and the photolithographic method were used for film formation and processing, respectively, and a uniaxial anisotropy magnetic field was given by means of film formation in a magnetic field. The measurements were all carried out at room temperatures.

Figure 12:
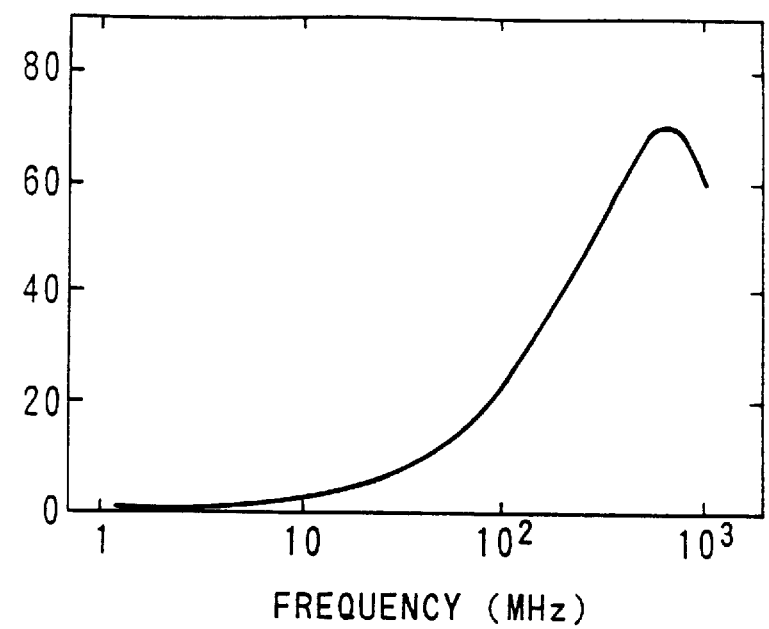
FIG. 12 shows an example of the frequency characteristics of the voltage change ratio ΔV/V(0) of the magnetic field sensing apparatus in accordance with the Second Embodiment of the present invention.
Figure 13:
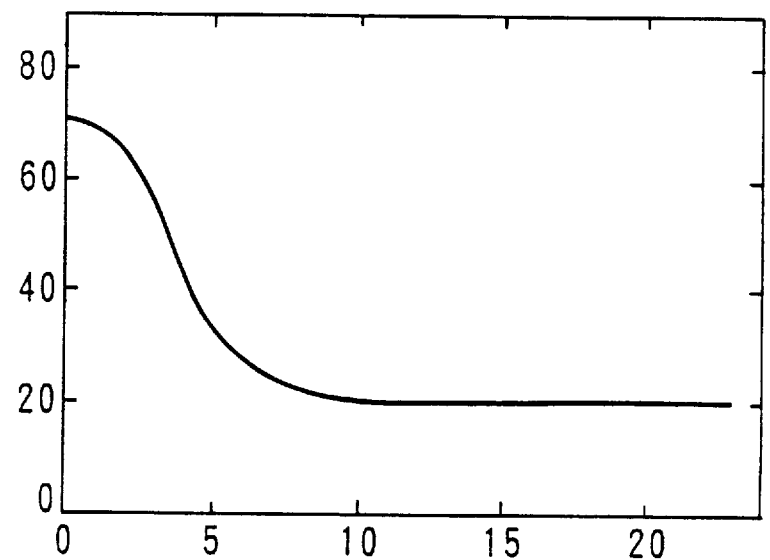
FIG. 13 shows an example of the dependency characteristics of the peak-to-peak voltage V between electrodes $64a_2$ and $64b_2$ with respect to an external magnetic field $H_{EX}$ in the magnetic field sensing apparatus in accordance with the Second Embodiment of the present invention.

In FIG. 12, an example of the frequency characteristics of the voltage change ratio $\Delta V/V(0)$ is shown. The voltage change ratio $\Delta V/V(0)$ has a large value within a range of 60–70% when the frequency of the high frequency current is within a range of from a few hundred MHz to the vicinity of 1 GHz. The reason that the value of the voltage change ratio $\Delta V/V(0)$ increases in this frequency band is that this frequency band coincides with the magnetic resonance frequency of the NiFe alloy which is employed in the magnetic material 65, which is 600–1000 MHz. An example of the dependence of the peak-to-peak voltage V between electrodes $64a_2$ and $64b_2$, with respect to the external magnetic field $H_{EX}$, at 800 MHz is shown in FIG. 13. As can be seen in FIG. 13, the peak-to-peak voltage V decreases greatly in the vicinity of 3–5 Oe, which is the uniaxial anisotropy magnetic field of NiFe, and acquires an essentially constant value at a level of 10 Oe. Hysteresis was not observed in FIG. 13, and accordingly, it was confirmed that the signal sensing accuracy was high.

As explained above, in order to obtain a high SN ratio and high sensitivity, it is effective to set the frequency of the high frequency current from high frequency generator 61 to the vicinity of the magnetic resonance frequency of magnetic material 65. In the Second Embodiment, the reproduced signal is reproduced in the form of an AM modulation using the signal from the high frequency generator 61 as a carrier. In this case, in order to stably sense the reproduced signal, it is necessary that magnetic sensor 60 possess broad-band characteristics of 2 or more times the frequency of the reproduced signal, centering on the carrier frequency. As can be seen from FIG. 12, the voltage change ratio $\Delta V/V(0)$ of the magnetic sensor 60 of the magnetic field sensing apparatus in accordance with the Second Embodiment has, for example, in a band larger than 60%, an extremely broad band on the level of 500 MHz within the range of 500 MHz–1 GHz, so that it is possible to stably reproduce a high frequency signal of approximately 250 MHz.

When the magnetic sensor 60 described above is formed by means of a thin film, examples of the film formation method therefor include, in addition to the ion beam sputtering method, the RF and DC sputtering method, the RF and DC magnetron sputtering method, the electroplating method; the vapor deposition method, and the like; similar effects may be achieved by any of these methods.

Examples of materials usable as magnetic materials 65a–65g and magnetic layers 68 include, for example, materials in which one or a plurality of elements selected from a group containing Fe, Co, Ni, Zr, Nb, Y, Hf, Ti, Mo, W, Ta, Si, B, and Re are added to Fe, Co, and Ni; and furthermore, examples of materials which may be used as the non-magnetic insulators 66a–66e and non-magnetic insulating layer 69 include, for example, $SiO_2$, AlN, $Al_2O_3$, BN, TiN, SiC, polyethylene naphthalate (PEN), polyethylene terephthalate (PET), polyimide, captone, photoresist, and the like, and materials which may be used as conductors 63a–63c include, for example, Cu, Al, Ag, Au, Pt, Sn, Cr, Zn, In, and the like; similar effects may be obtained when any of these is employed.

As is clear from the effects above, the magnetic sensor of the magnetic field sensing apparatus in accordance with the Second Embodiment has a higher reproduction output, SN ratio, sensitivity, and signal sensing accuracy than the conventional magnetic sensor, and furthermore, possesses an advantage in that the component structure thereof is simple.

Figure 14A:
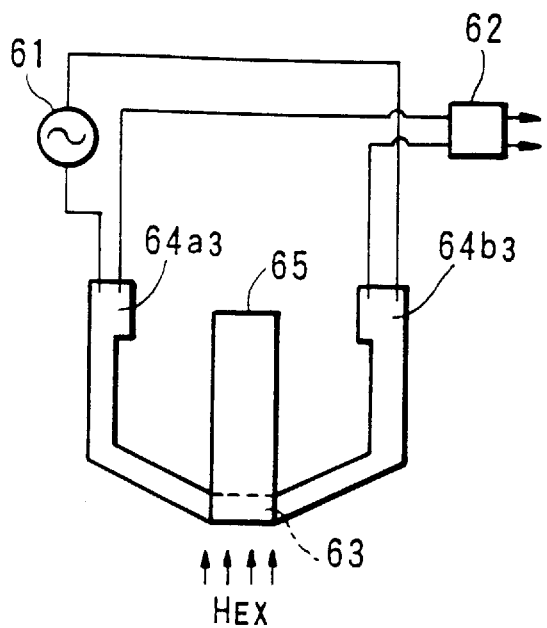
FIG. 14A shows another structure of the magnetic field sensing apparatus in accordance with the Second Embodiment of the present invention.
Figure 14B:
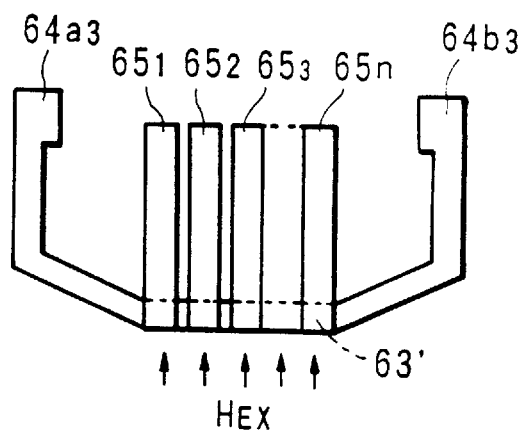
FIG. 14B shows another structure of a magnetic sensor which is used in the magnetic field sensing apparatus in accordance with the Second Embodiment of the present invention.
Figure 14C:
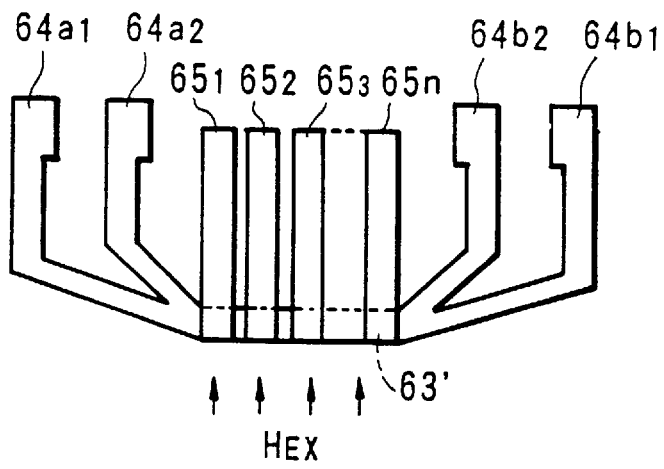
FIG. 14C shows another structure of a magnetic sensor which is used in the magnetic field sensing apparatus in accordance with the Second Embodiment of the present invention.

FIGS. 14A–14C show other structures of the magnetic field sensing apparatus in accordance with the Second Embodiment, and the magnetic sensor employed therein. In these Figures, parts corresponding to parts in FIG. 7 are given identical reference numerals, and an explanation thereof will be omitted here. FIG. 14A shows an example in which a pair of electrodes $64a_3$ and $64b_3$, and one magnetic material 65 are provided; FIG. 14B shows an example in which a pair of electrodes $64a_3$ and $64b_3$, and a number n of magnetic materials $65_1$–$65_n$ are provided; and FIG. 14C shows an example in which 2 pairs of electrodes $64a_1$ and $64b_1$ and $64a_2$ and $64b_2$, and a number n of magnetic materials $65_1$–$65_n$ are provided. In FIGS. 7 and 14C, 2 pairs of electrodes are provided, so that the structure is somewhat more complex; however, a large voltage change ratio (SN ratio) can be obtained. On the other hand, in the structure shown in FIGS. 14A and 14B, in which one pair of electrodes $64a_3$ and $64b_3$ are provided, the voltage change ratio is slightly inferior to that in the structure in which 2 pairs of electrodes $64a_1$ and $64b_1$, and $64a_2$ and $64b_2$, are provided; however, the structure thereof is simple and thus easily produced. The number n of magnetic materials makes little difference from the point of view of the characteristics.

THIRD EMBODIMENT

Figure 15:
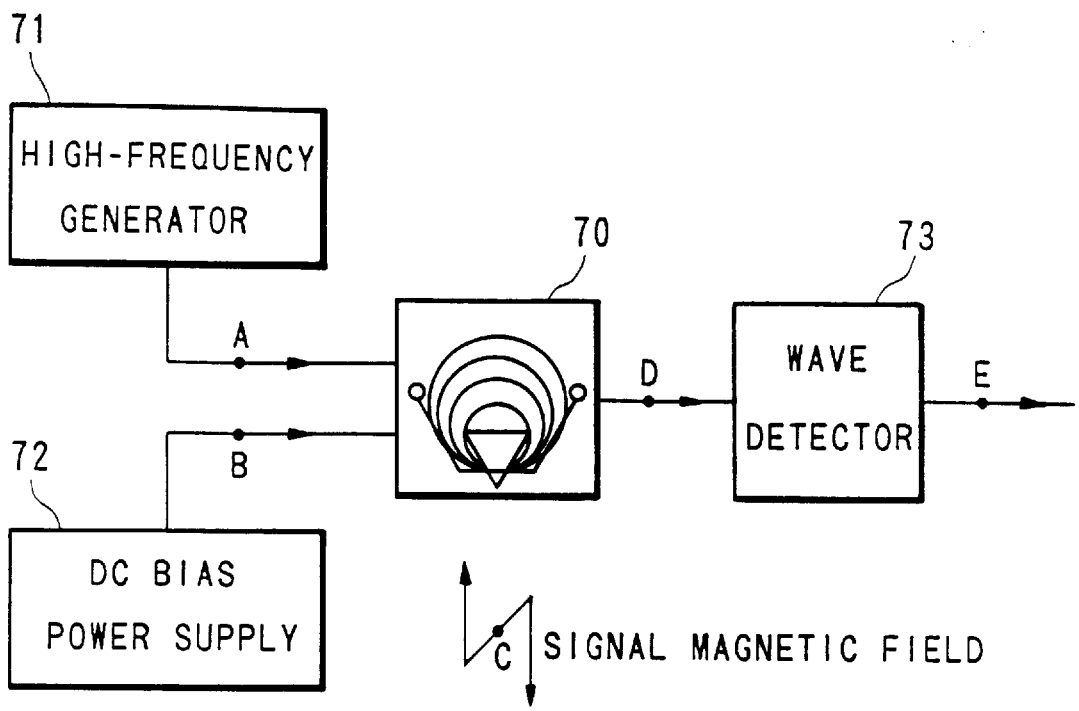
FIG. 15 is a block diagram showing, in schematic form, the structure of the magnetic field sensing apparatus in accordance with a Third Embodiment of the present invention.
Figure 16A:
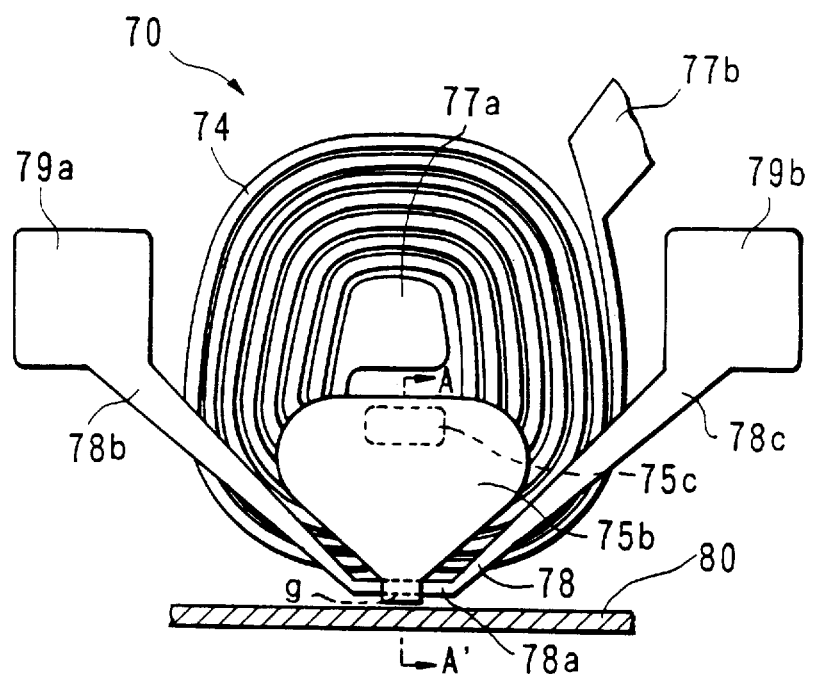
FIG. 16A is a front view of a magnetic sensor 70 which is employed in the magnetic field sensing apparatus in accordance with the Third Embodiment of the present invention.
Figure 16B:
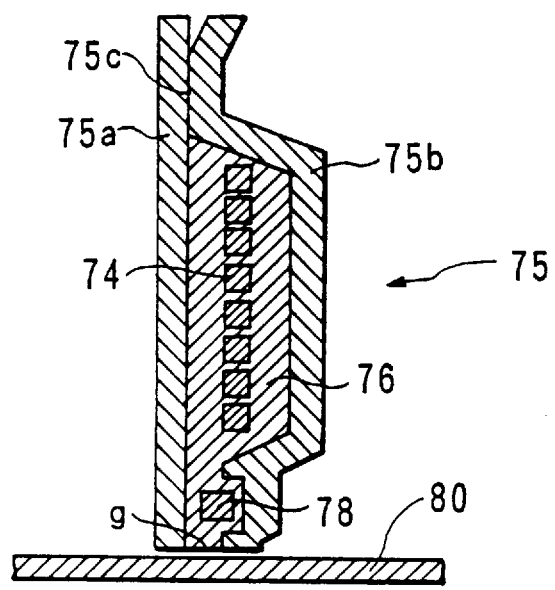
FIG. 16B is a cross sectional view taken along the line A–A' in FIG. 16A.
Figure 18A:
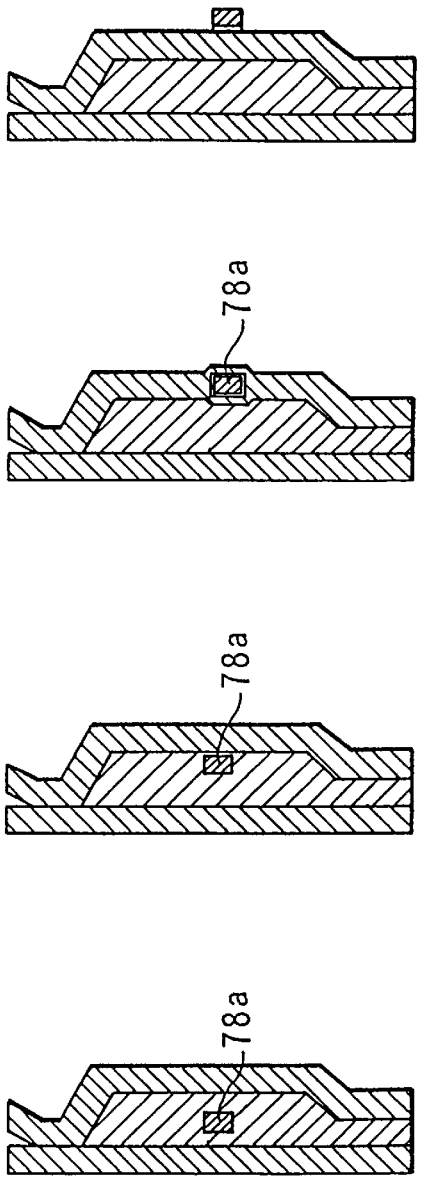
FIG. 18A shows, in schematic form, another structure of the magnetic sensor 70.
Figure 18B:
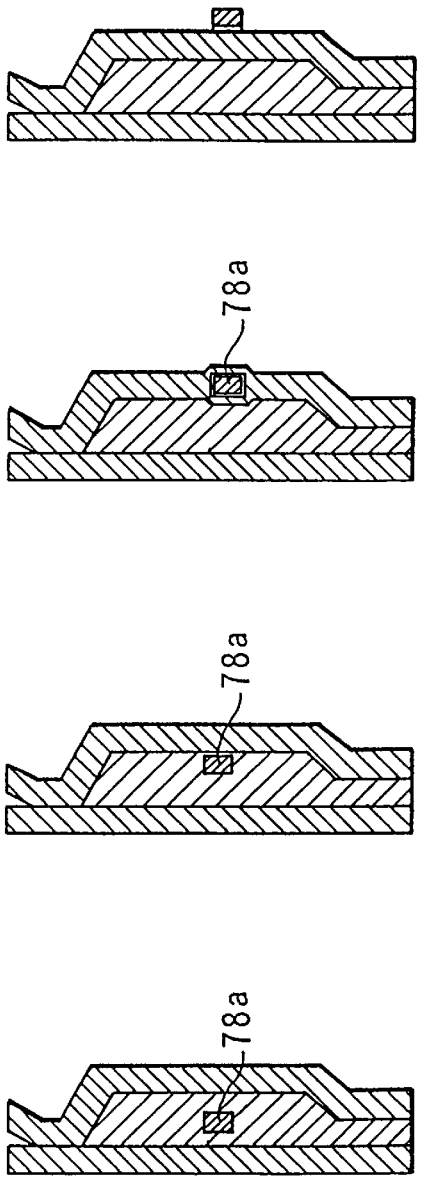
FIG. 18B shows, in schematic form, another structure of the magnetic sensor 70.
Figure 18C:
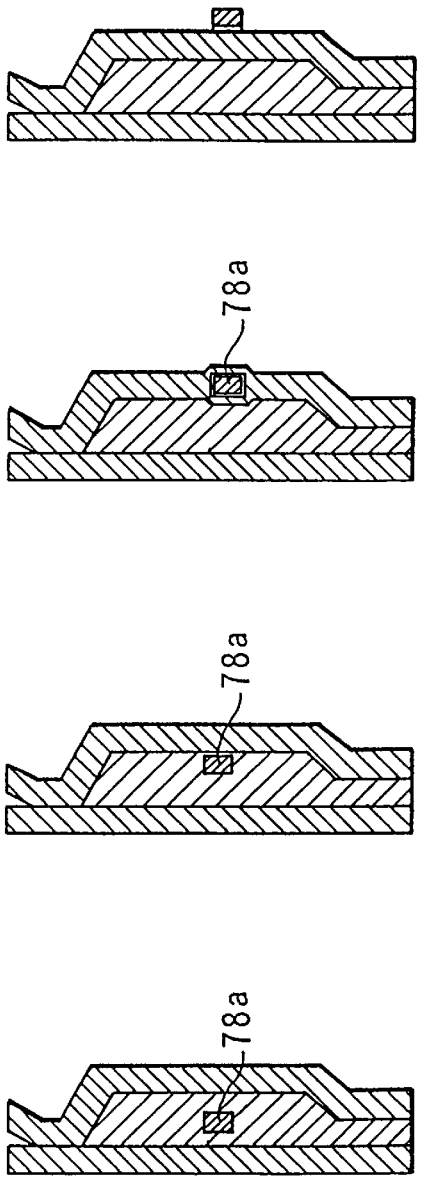
FIG. 18C shows, in schematic form, another structure of the magnetic sensor 70.
Figure 18D:
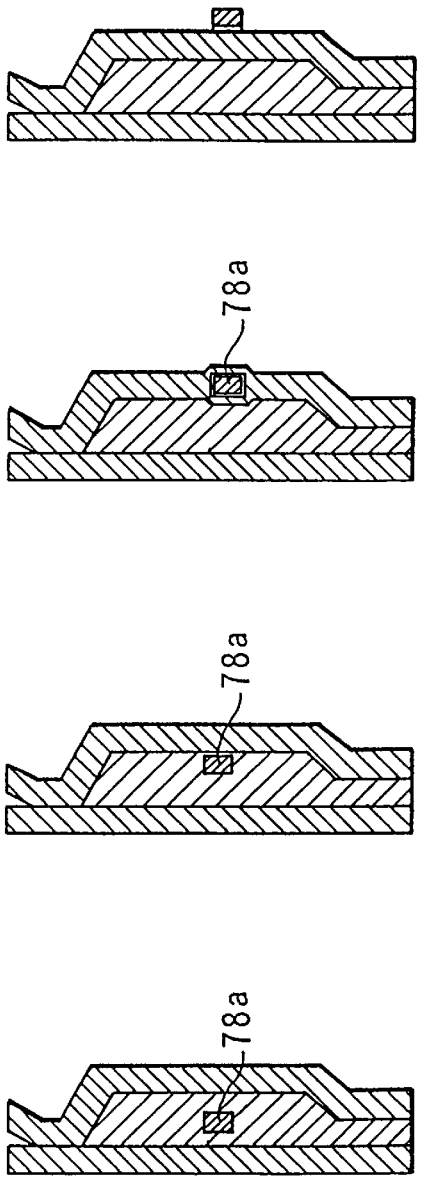
FIG. 18D shows, in schematic form, another structure of the magnetic sensor 70.
Figure 18E:
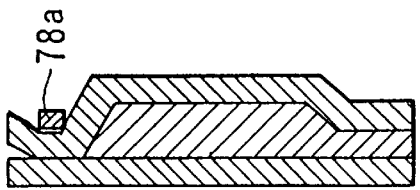
FIG. 18E shows, in schematic form, another structure of the magnetic sensor 70.
Figure 18F:
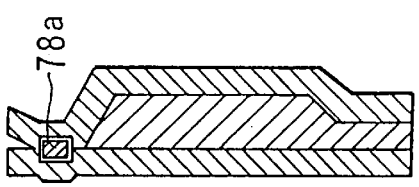
FIG. 18F shows, in schematic form, another structure of the magnetic sensor 70.
Figure 18G:
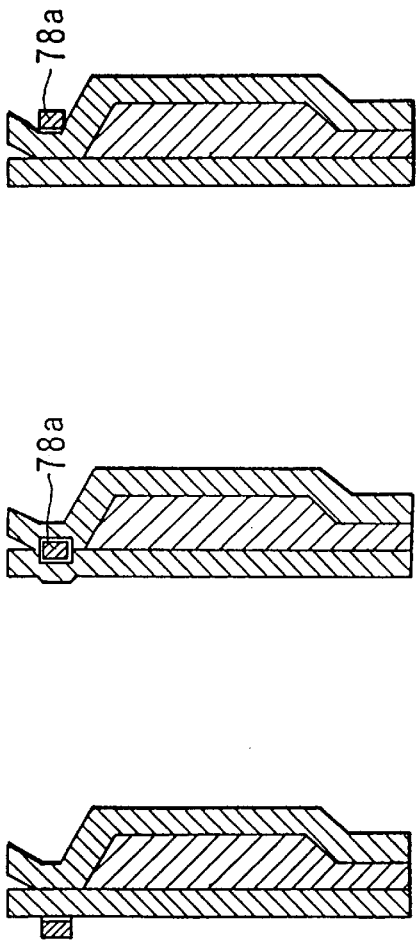
FIG. 18G shows, in schematic form, another structure of the magnetic sensor 70.

Next, a Third Embodiment of the present invention will be explained. FIG. 15 is a block diagram showing, in schematic form, the structure of a magnetic field sensing apparatus in accordance with the Third Embodiment of the present invention. In FIG. 15 the magnetic field sensing apparatus comprises: a magnetic sensor 70, a high frequency generator 71, a DC bias power supply 72, and a wave detector 73. FIG. 16A shows a front view of the magnetic sensor 70, and FIG. 16B is a cross sectional view taken along the line A–A' in FIG. 16A. In FIGS. 16A and 16B, the magnetic sensor comprises a coil 74, a magnetic core 75, a non-magnetic insulator 76, coil electrodes 77a and 77b, a conductor 78, and conductor electrodes 79a and 79b.

In the magnetic sensor 70 shown in FIGS; 16A and 16B, the coil 74 is wound in a spiral shape from the center thereof in an outward direction. Magnetic core 75 comprises magnetic materials 75a and 75b, which comprise single sheet magnetic materials. Magnetic materials 75a and 75b grip a portion of the lower side of coil 74, and are fastened by means of magnetic core coupler 75c. A gap g possessing a very small space is formed at the lower end between magnetic materials 75a and 75b. Non-magnetic insulator 76 fills the space between magnetic materials 75a and 75b in order to continuously support coil 74. Coil electrodes 77a and 77b are electrically connected to the two ends, the center and peripheral end, of coil 74. Between magnetic material 75a and magnetic material 75b, a sensing end 78a of the horizontal lower edge portion of a V-shaped conductor 78 passes through the non-magnetic insulator 76 in the vicinity of gap g. Conductor electrodes 79a and 79b are unitarily connected to the upper edges of wing-shaped portions 78b and 78c, which are widenings of the upper left and right ends of conductor 78.

FIGS. 17A–17H and 18A–18G show, in schematic form, other structures of the magnetic sensor 70; these correspond, respectively, to FIG. 16B. Insofar as the energy of the high frequency electromagnetic wave resulting from the high frequency current passed through conductor 78 can be applied to the magnetic core 75, the sensing end 78a may be disposed at a freely selected position either within the magnetic core 75, as shown in FIG. 17B, FIG. 17D, FIG. 17G, FIG. 18C, and FIG. 18F, or in the vicinity of the magnetic core 75, as shown in FIG. 17A, FIG. 17C, FIG. 17E, FIG. 17F, FIG. 17H, FIG. 18A, FIG. 18B, FIG. 18D, FIG. 18E, and FIG. 18G; many variations are possible in addition to those shown in FIGS. 17A–17H and 18A–18G. Similar effects can be obtained even if a plurality of conductor electrodes 79a and 79b are provided, or if the sensing end 78a is disposed directly on magnetic core 75.

Next, the operation of the magnetic field sensing apparatus in accordance with the Third Embodiment will be explained. First, in the recording process, a current corresponding to the data which are to be recorded is caused to flow in coil 74, and magnetic core 75 is magnetized, and thereby, the magnetic recording medium 80 (see FIGS. 16A and 16B) is magnetized as a result of the leakage magnetic field from gap g, and the signal is recorded.

In the reproducing process, the high frequency current from the high frequency generator 71 (see FIG. 15) is applied to the conductor 78, and based on changes in the impedance of conductor 78 resulting from the magnetization state of the magnetic core 75, reproduction is carried out.

Hereinbelow, the operational principle of the reproducing process will be explained. When a high frequency current having a frequency f is supplied to the conductor 78 by means of applying, between conductor electrodes 79a and 79b, a high frequency current having a frequency f which is generated by the high frequency generator 71, the high frequency magnetic field generated based on this high frequency current is reflected and absorbed by magnetic materials 65a and 65b, so that the impedance Z(f) of magnetic sensor 70 at a frequency f is expressed by the Formula (2) shown above.

The amount of increase $\Delta Z_{mag}(f)$ in the impedance in the above-described Formula (2) has the relationship to the relative magnetic permeability $\mu_r(f)$ of the magnetic core 78 which is shown in the Formula (3) above.

When the magnetic core 75 becomes magnetized by external magnetic field $H_{EX}$, the value of the relative magnetic permeability $\mu_r(f)$ decreases, and in the magnetization saturation state, the relative magnetic permeability $\mu_r(f)$ has a value of 0. At this time, the dependency of the peak-to-peak voltage V produced between conductor electrodes 79a and 79b on external magnetic field $H_{EX}$ is shown conceptually in FIG. 19.

If the amplitude of the high frequency current is made essentially constant, the SN ratio of the magnetic sensor 70 is expressed by the Formula (5) shown above. In this Third Embodiment, in Formula (5), V(0) represents the peak-to-peak voltage between conductor electrodes 79a and 79b in the case in which an external magnetic field $H_{EX}$ is not applied, and V(H) represents the peak-to-peak voltage between conductor electrodes 79a and 79b when the magnetic core 75 is saturated. Since the value of impedance $Z_0(f)$ is small, and the amount of increase $\Delta Z_{mag}(f)$ in the impedance becomes large in high frequency regions, then from Formula (5), the voltage change ratio $\Delta V/V(0)$ acquires an extremely high value, and the SN ratio has an extremely high value. Furthermore, the magnetic core 75 of magnetic sensor 70 has characteristics such that it is saturated by a weak magnetic field, and has small hysteresis, so that the sensitivity and the signal sensing accuracy are improved.

Figure 19:
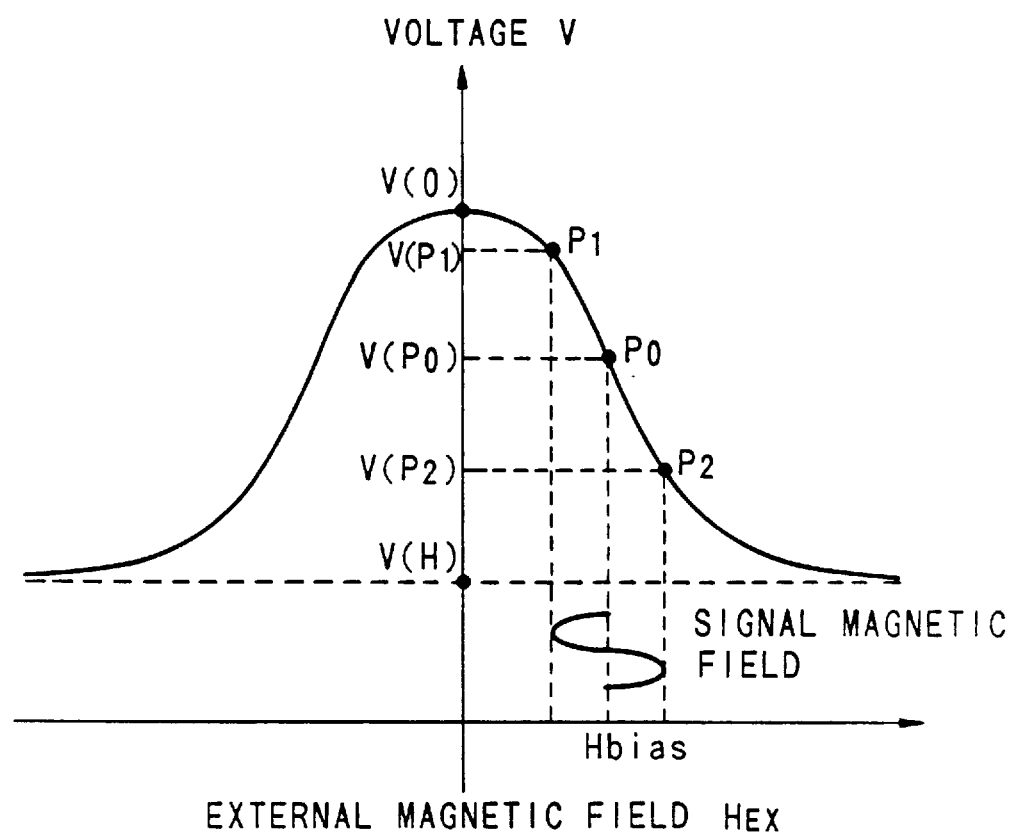
FIG. 19 shows an example of the dependency characteristics of the peak-to-peak voltage V between conductor electrodes 79a and 79b with respect to an external magnetic field $H_{EX}$ in the magnetic field sensing apparatus in accordance with the Third Embodiment of the present invention.
Figure 25:
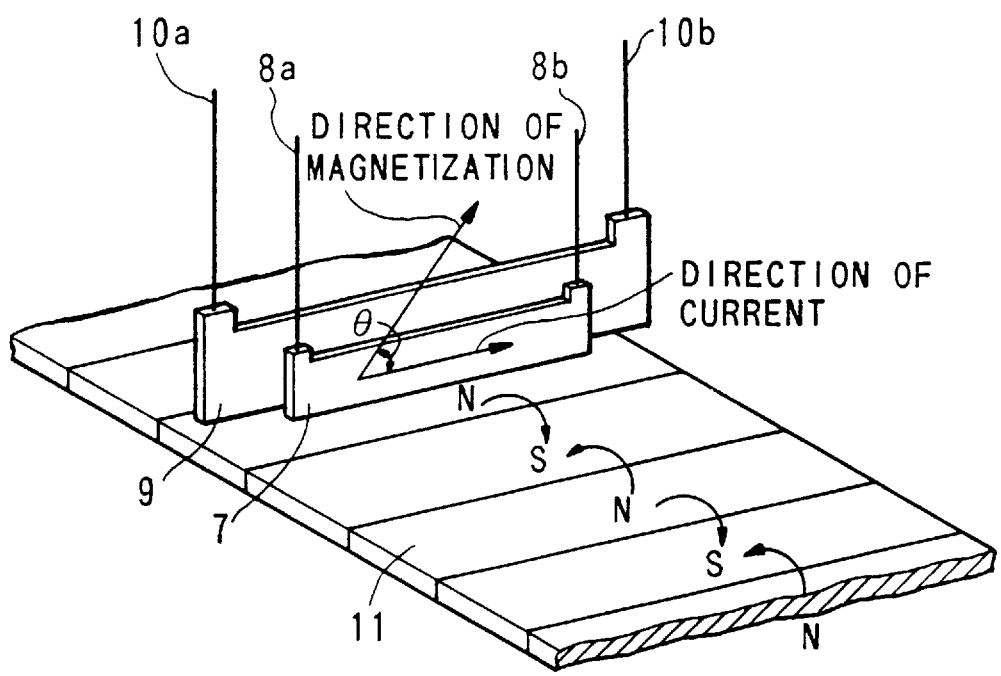
FIG. 25 is an angled view showing an example of the structure of a conventional MR head.

Furthermore, in order to sense the polarity of the external magnetic field $H_{EX}$, a DC bias magnetic field $H_{bias}$ is generated by supplying a DC bias current to conductor 78 or coil 74, and the operational point along the V-H curve as shown in FIG. 19 is moved to $P_0$. In this case, in the magnetic sensor 70 which is employed in the magnetic field sensing apparatus of the Third Embodiment, conductor 78 or coil 74 is used in addition to the DC bias conductor 9 of the conventional MR head shown in FIG. 25, so that the component structure is simplified. Furthermore, the operational point $P_0$ is set at the point on the V-H curve having the maximum slope, and thereby, it is possible to further increase the sensing sensitivity. In addition to the functions of wave detection and demodulation, wave detector 73 must have the function of cutting the DC current during the process of wave detection in order to cancel the pre-installed DC bias current from the signal to be detected.

Next, the operation of the magnetic field sensing apparatus shown in FIG. 15 will be explained with reference to FIGS. 20A through 20E.

Figure 20A:
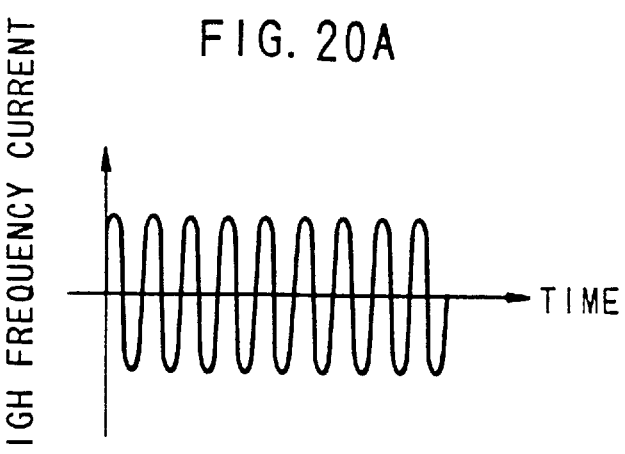
FIG. 20A serves to explain the operation of the magnetic field reproduction apparatus in accordance with the Third Embodiment of the present invention.
Figure 20B:
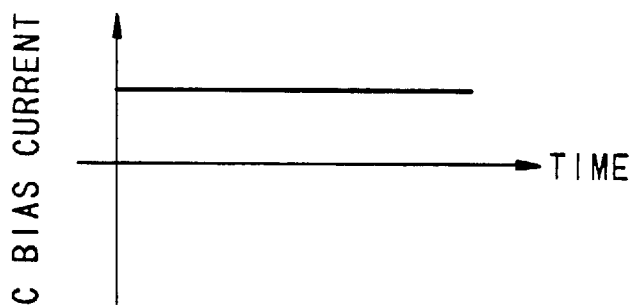
FIG. 20B serves to explain the operation of the magnetic field reproduction apparatus in accordance with the Third Embodiment of the present invention.

High frequency generator 71 supplies a high frequency current to conductor 78 by means of the application of a high frequency current of, for example, 800 MHz, such as that shown in FIG. 20A, between conductor electrodes 79a and 79b. Furthermore, the DC bias power supply 72 supplies a DC bias current to conductor 78 or coil 74 by means of applying a DC bias current such as that shown in FIG. 20B between conductor electrodes 79a and 79b, or coil electrodes 77a and 77b.

Figure 20C:
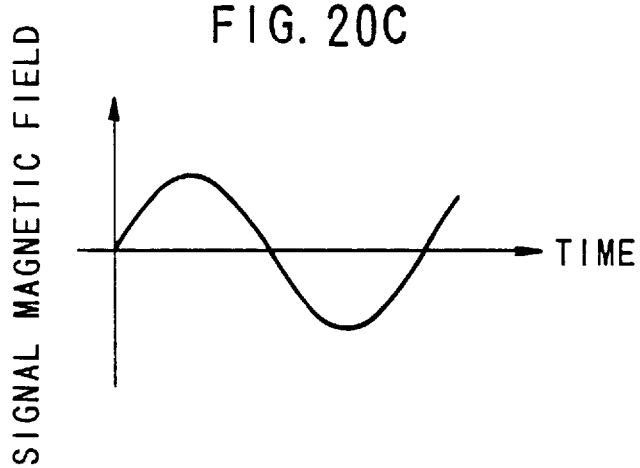
FIG. 20C serves to explain the operation of the magnetic field reproduction apparatus in accordance with the Third Embodiment of the present invention.

By means of this DC bias current, a DC bias magnetic field $H_{bias}$ is generated, and operational point P is moved to operational point $P_0$ which is shown in FIG. 19. Here, a magnetic field of, for example, 30 MHz, which is shown in FIG. 20C, is applied as the signal magnetic field, and by means of this, the voltage V between the conductor electrodes 79a and 79b alternates between the voltage V (operational point $P_1$) and the voltage V (operational point $P_2$), which are shown in FIG. 19.

Figure 20D:
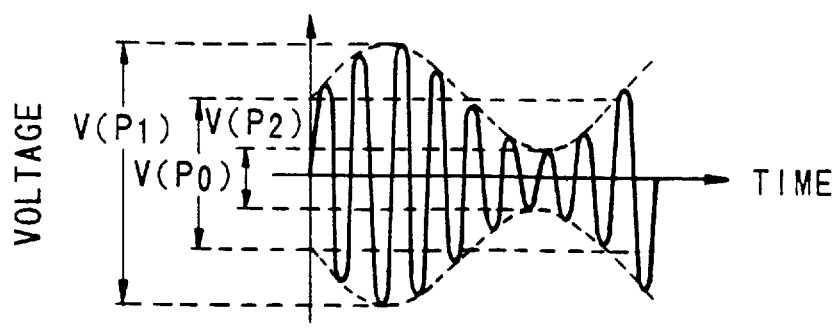
FIG. 20D serves to explain the operation of the magnetic field reproduction apparatus in accordance with the Third Embodiment of the present invention.
Figure 20E:
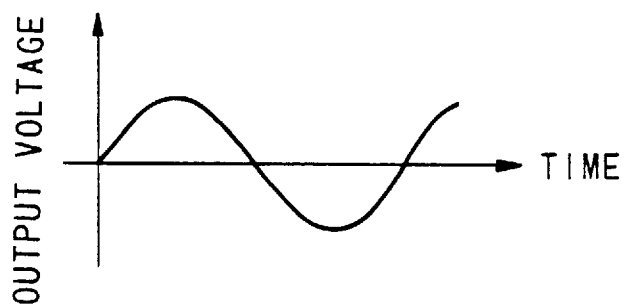
FIG. 20E serves to explain the operation of the magnetic field reproduction apparatus in accordance with the Third Embodiment of the present invention.

A voltage in which an 800 MHz signal is amplitude modulated with a 30 MHz signal is generated between conductor electrode 79a and 79b, as shown in FIG. 20D after cutting a DC current. This is detected by wave detector 73, and thereby, it is possible to reproduce the 30 MHz signal as the output voltage shown in FIG. 20E.

In the magnetic field sensing apparatus in accordance with the Third Embodiment, the phenomenon of the reflection and absorption of the high frequency electromagnetic wave by the magnetic core 75 was employed; however, at this time, as a result of the skin effect, the effective volume of the magnetic core 75 is reduced, and the amount of the reflection and absorption decreases.

Figure 21:
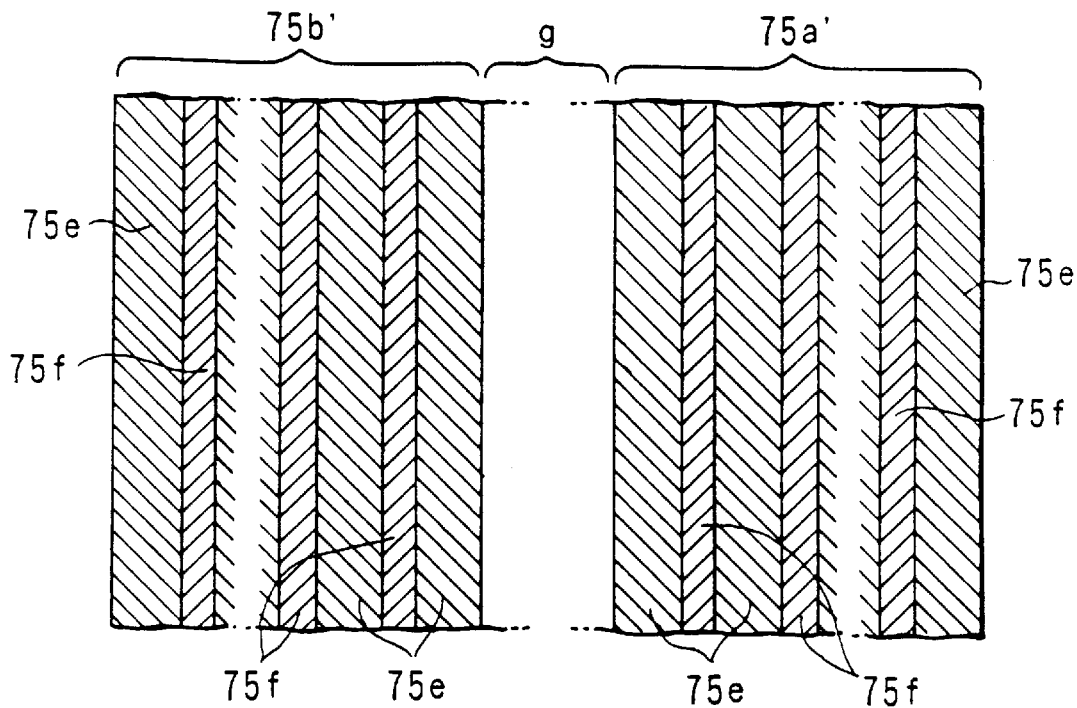
FIG. 21 is a cross sectional view showing another structure of the magnetic material 75 of the magnetic sensor 70.

An effective method for the avoidance thereof is, as shown in FIG. 21, to provide, in place of the magnetic materials 75a and 75b of the magnetic core 75, laminated magnetic materials 75'a and 75'b which have a multi-layered structure in which magnetic layers 75e and non-magnetic insulator layers 75f are alternately layered; furthermore, in this case, the formation of the magnetic layers 75e with a thickness which is thinner than the skin depth, and the formation of the non-magnetic insulator layers 75f with at least a thickness which is capable of maintaining electrical insulation between magnetic layers 75e, is further effective. Here, the skin depth is expressed by Formula (7) shown above.

Furthermore, an example of the results of the measurement of the magnetic field sensing apparatus in accordance with the Third Embodiment is shown. In this measurement example, a NiFe alloy having a thickness of 50 nm was used in the magnetic layers 75e of the laminated magnetic materials 75'a and 75'b of the magnetic core 75, and $SiO_2$ having a thickness of 50 nm was used in the non-magnetic insulator layers 75f, and the multi-layered structure shown in FIG. 21 was adopted.

Furthermore, the total film thickness of the magnetic core 75 was set to 3 $\mu$m, the width of the lower end portion of the magnetic core 75 was set to 10 $\mu$m, and the length of gap g was set to 0.3 $\mu$m, while Cu having a thickness of 1 $\mu$m was used in conductor 78, and the width of conductor 78 was set to 10 $\mu$m. The ion-beam sputtering method and the photolithographic method were used for film formation and processing, respectively, and a uniaxial anisotropy magnetic field was given by means of film formation in a magnetic field. The measurements were all carried out at room temperatures.

Figure 22:
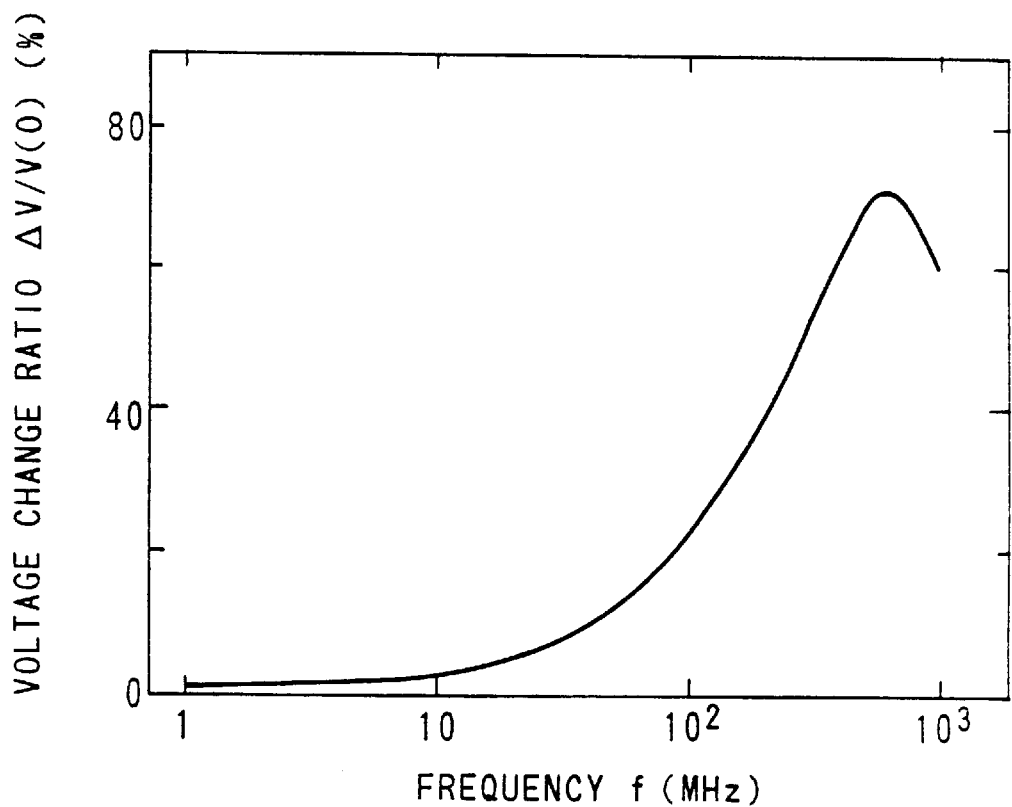
FIG. 22 shows an example of the dependency characteristics of the voltage change ratio ΔV/V(0), with respect to the frequency f, in the magnetic field sensing apparatus in accordance with the Third Embodiment of the present invention.
Figure 24A:
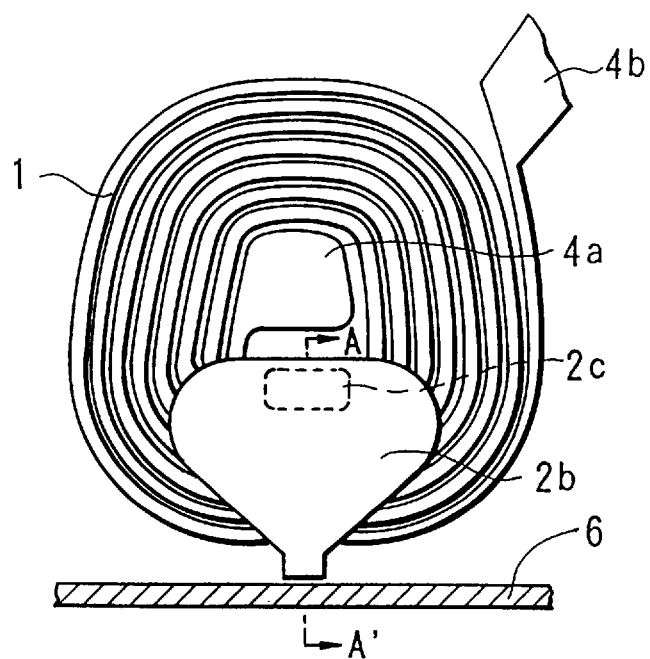
FIG. 24A is a front view showing an example of the structure of a conventional ring-type inductive magnetic head.
Figure 24B:
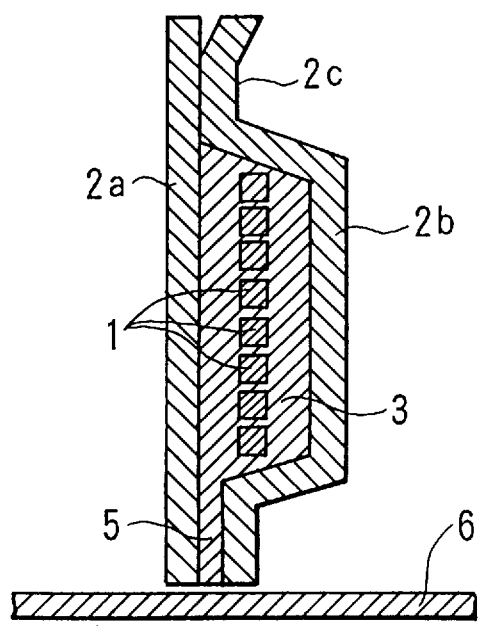
FIG. 24B is a cross sectional view taken along the line A–A' in FIG. 24A.

In FIG. 22, an example of the dependency on the frequency f of the voltage change ratio $\Delta V/V(0)$ of the magnetic field sensing apparatus in accordance with the Third Embodiment is shown. The voltage change ratio $\Delta V/V(0)$ has a large value within a range of 60–70% within a frequency range of from a few hundred MHz to the vicinity of 1 GHZ. The reason that the voltage change ratio $\Delta V/V(0)$ becomes large in this frequency band is that this frequency band coincides with the magnetic resonance frequency, 600 MHz–1 GHz, of the NiFe alloy which is employed in the magnetic core 75.

Here, an example of the dependence, on the external magnetic field $H_{EX}$, of the peak-to-peak voltage V at a frequency of 800 MHz is shown in FIG. 23. The peak-to-peak voltage V decreases greatly at approximately 5 Oe, which is the anisotropic magnetic field of NiFe, and attains an essentially constant value at approximately 20 Oe.

As explained above, in the present measurement example, a large voltage change ratio within a range of 60–70% is obtained, and furthermore, a large voltage change is produced even in response to a small external magnetic field $H_{EX}$ of a few Oe, so that the sensitivity is high. Furthermore, even when increases and decreases in the external magnetic field $H_{EX}$ were repeated, hysteresis was not observed, and thus the signal sensing accuracy was determined to be high.

As shown in FIG. 22, the voltage change ratio $\Delta V/V(0)$ attains a maximum value when the frequency of the high frequency current is in the vicinity of the magnetic resonance frequency of the magnetic material used in magnetic core 75. Accordingly, in order to obtain a high SN ratio and high sensitivity, it is effective to operate the magnetic field sensing apparatus in accordance with the Third Embodiment in the vicinity of the magnetic resonance frequency of the magnetic material which is used in the magnetic core 75.

In the case in which the magnetic sensor 70 described above is formed by means of a thin film, examples of methods which may be used as the film formation method therefor include, in addition to the ion beam sputtering method, the RF and DC sputtering method, the RF and DC magnetron sputtering method, the electroplating method, and the vapor deposition method and the like; similar effects may be achieved by using any of these methods.

Furthermore, materials usable in magnetic core 75 and magnetic layers 75e include materials in which one or a plurality of elements selected from a group containing Fe, Co, Ni, Zr, Nb, Y, Hf, Ti, Mo, W, Ta, Si, B, and Re are added to Fe, Co, and Ni; examples of materials which may be used in non-magnetic insulators 76 and non-magnetic insulator layers 75f include, for example, $SiO_2$, AlN, $Al_2O_3$, BN, TiN, SiC, polyethylene naphthalate (PEN), polyethylene terephthalate (PET), polyimide, captone, photoresist, and the like; furthermore, materials which may be used in conductor 78 and coil 74 include, for example, Cu, Al, Ag, Au, Pt, Sn, Cr, Zn, and In; similar effects may be obtained when any of the above are employed.

What is claimed is:

1. A magnetic field sensing method comprising the steps of:

placing a conductor, with at least one magnetic material provided directly on any of the surfaces of the conductor, in the vicinity of an external magnetic field to be sensed;

said magnetic material being formed with a multi-layered structure in which magnetic layers and non-magnetic insulator layers are alternatively layered, a thickness of each magnetic layer being thinner than a skin depth, and each non-magnetic insulator layer having a thickness capable of at least maintaining electrical insulation between the magnetic layers;

supplying, through a first pair of lead wires, a high frequency current through the conductor of a frequency approximately equal to a magnetic resonance frequency of the magnetic material; and sensing, through a second pair of lead wires, the external magnetic field based on voltage changes obtained through the second pair of lead wires by converting changes in the impedance of the conductor due to the magnetic material into voltage changes by means of a four-terminal method.

2. A magnetic field sensing method comprising the steps of:

providing a magnetic material on any of the surfaces of a conductor through the medium of a non-magnetic insulator covering the entirety of the conductor;

placing the conductor in the vicinity of an external magnetic field to be sensed;

supplying, through a first pair of lead wires, a high frequency current through the conductor of a frequency approximately equal to a magnetic resonance frequency of the magnetic material; and sensing, through a second pair of lead wires, the external magnetic field based on voltage changes obtained through the second pair of lead wires by converting changes in the impedance of the conductor due to the magnetic material into voltage changes by means of a four-terminal method.

3. A magnetic field sensing method in accordance with claim 1, further including the step of supplying a DC bias current to the conductor in addition to the high frequency current.

4. A magnetic field sensing method in accordance with claim 3, wherein the DC bias current is set to a value to maximize the slope of the voltage change at both ends of the conductor with respect to changes in the external magnetic field.

5. A magnetic field sensing method in accordance with claim 1 additionally comprising the steps of:

forming the magnetic material in a rectangular plate shape having a long side and a short side; and placing the magnetic material on the conductor such that the long side is parallel with the external magnetic field and uniaxial magnetic anisotropy is present such that the short side direction thereof is along an easy axis.

6. A magnetic field sensing method comprising the steps of:

providing a magnetic material on any of the surfaces of a conductor through the medium of a non-magnetic insulator covering almost the entirety of the conductor;

placing the conductor in the vicinity of an external magnetic field to be sensed;

supplying, through a first pair of lead wires, a high frequency current through the conductor of a frequency approximately equal to a magnetic resonance frequency of the magnetic material; and sensing, through a second pair of lead wires, the external magnetic field based on voltage changes obtained through the second pair of lead wires by converting changes in the impedance of the conductor due to the magnetic material into voltage changes by means of a four-terminal method.

7. A magnetic field sensing method in accordance with claim 1, wherein the current supplied through the conductor is of a frequency within 200 MHz of the magnetic resonance frequency of the magnetic material.

8. A magnetic field sensing apparatus, comprising:

a magnetic sensor, including a conductor, with at least one magnetic material provided on any of the surfaces of the conductor and disposed in the vicinity of an external magnetic field to be sensed;

said magnetic material being formed with a multi-layered structure in which magnetic layers and non-magnetic insulator layers are alternatively layered, a thickness of each magnetic layer being thinner than a skin depth, and each non-magnetic insulator layer having a thickness capable of at least maintaining electrical insulation between the magnetic layers;

a high frequency generator for supplying, through a first pair of lead wires, a current of high frequency approximately equal to a magnetic resonance frequency of the magnetic material to the conductor; and a wave detector for detecting, through a second pair of lead wires, changes in voltage amplitude obtained at both ends of the conductor by converting changes in impedance of the conductor due to the magnetic material in accordance with the external magnetic field into voltage changes by means of a four-terminal method.

9. A magnetic field sensing apparatus in accordance with claim 8, wherein the high frequency generator supplies a current of high frequency within 200 MHz of the magnetic resonance frequency of the magnetic material to the conductor.

* * * * *